United States Patent
Sugiyama et al.

(10) Patent No.: US 7,128,516 B2
(45) Date of Patent: Oct. 31, 2006

(54) WORKPIECE TRANSPORT APPARATUS

(75) Inventors: Akira Sugiyama, Tenri (JP); Tsuneo Nakamura, Soraku-gun (JP); Tatsushi Yamamoto, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 203 days.

(21) Appl. No.: 10/799,142

(22) Filed: Mar. 11, 2004

(65) Prior Publication Data

US 2004/0197184 A1    Oct. 7, 2004

(30) Foreign Application Priority Data

Mar. 19, 2003    (JP) .............................. 2003-075948

(51) Int. Cl.
  *B65G 53/16*    (2006.01)
  *B65G 47/24*    (2006.01)
(52) U.S. Cl. .................. 414/676; 414/758; 65/182.2; 406/87; 406/88
(58) Field of Classification Search .... 65/182.1–182.2; 414/676, 754, 755, 758; 406/87–90
See application file for complete search history.

(56) References Cited

U.S. PATENT DOCUMENTS

| | | | | |
|---|---|---|---|---|
| 2,520,252 A | * | 8/1950 | Mutchler | ................... 414/622 |
| 3,665,730 A | * | 5/1972 | Linzer | ....................... 65/182.2 |
| 4,172,513 A | * | 10/1979 | Bradstreet et al. | .......... 198/380 |
| 4,715,775 A | * | 12/1987 | Amino | ....................... 414/758 |
| 4,853,018 A | * | 8/1989 | Koss et al. | .................... 65/94 |
| 5,743,374 A | * | 4/1998 | Monsees | ..................... 198/403 |
| 6,079,227 A | * | 6/2000 | Yoshizawa et al. | ............ 65/95 |
| 6,220,056 B1 | * | 4/2001 | Ostendarp | .................... 65/175 |

FOREIGN PATENT DOCUMENTS

| | | | |
|---|---|---|---|
| JP | 57141337 A | * | 9/1982 |
| JP | 57175644 A | * | 10/1982 |
| JP | 60228345 A | * | 11/1985 |
| JP | 62012555 A | * | 1/1987 |
| JP | 62088751 A | * | 4/1987 |
| JP | 10-264071 | | 10/1998 |
| JP | 10264071 A | * | 10/1998 |
| JP | 11-347779 | | 12/1999 |
| JP | 11347779 A | * | 12/1999 |

* cited by examiner

*Primary Examiner*—Gene O. Crawford
*Assistant Examiner*—Charles Greenhut
(74) *Attorney, Agent, or Firm*—David G. Conlin; David A. Tucker; Edwards Angell Palmer & Dodge LLP

(57) ABSTRACT

While periphery or peripheries of workpiece(s) W lifted in floating fashion by simultaneous suction and expulsion of gas(es) between pair(s) of first and second, or upper and lower, transport stages 14, 15 is/are retained by plurality of elevator pins 16, respective transport stage(s) is/are inverted vertically and workpiece(s) is/are transferred from upper first transport stage(s) to lower second transport stage(s) such that workpiece(s) W is/are lifted in floating fashion thereabove by simultaneous suction and expulsion of gas(es) in accompaniment to lowering of respective elevator pin(s) at said first transport stage(s).

3 Claims, 16 Drawing Sheets

WORKPIECE TRANSPORT APPARATUS

BACKGROUND OF INVENTION

This application claims priority under 35 USC 119(a) to patent application No. 2003-75948 filed in Japan on 21 Jan. 2003, the content of which is incorporated herein by reference in its entirety.

The present invention pertains to a workpiece transport apparatus transporting glass substrate, semiconductor wafer, and/or other such workpiece during manufacture of semiconductor, liquid crystal display element, EL (electroluminescent), PDP (plasma display panel) and/or other such flat panel display, solar cell panel, and/or the like; and is in particular related to a strategy for smoothly flipping a workpiece so as to reverse front and back sides thereof for the purpose of carrying out processing of the backside, and/or of both sides, of the workpiece.

During cleaning, photolithography, and/or other such operations carried out on glass substrates and/or semiconductor wafers (hereinafter collectively referred to as "workpiece(s)") at sites at which semiconductors, flat panel displays, solar cells, and/or the like are manufactured, where a need has arisen to flip so as to reverse front and back sides of a workpiece, mechanical chucks, vacuum chucks, electrostatic chucks, and other such chuck mechanisms have conventionally been employed to flip the workpiece while supporting the end of the workpiece or holding the backside of the workpiece against another surface.

As shown in FIGS. 20 and 21, in one example of such a workpiece transport apparatus, transport workpiece 201 is transported through four transport locations P1 through P4 (transport location P1 being a location occupied following application of liquid coating, P2 being a workpiece side cleaning processing location, P3 being a standby location, and P4 being a location occupied following the operation), workpiece 201 being flipped as it is transported so as to reverse front and back sides thereof during transport from transport location P1 to P2 (see, e.g., Japanese Patent Application Publication Kokai No. H10-264071 (1998)). Moreover, flipping of workpiece 201 so as to reverse front and back sides thereof is carried out by using a motor (not shown) constituting drive unit 204 for plurality of mechanical chuck means 202, . . . as drive source to rotarily drive workpiece 201 in the direction indicated by arrow 205 while the periphery thereof is chucked at prescribed locations by chuck appendages 203 of mechanical chuck means 202. Chucking of workpiece 201 by chuck appendages of such respective chuck means 202 is carried out by way of sliding shaft 207 which engages in sliding action as a result of being directly driven by an air cylinder. Where this is the case, transfer of the workpiece among respective transport locations P1 through P4 may be carried out by means of a separate robot, not shown.

However, with the foregoing conventional workpiece transport apparatus, because workpiece 201 is chucked by chuck appendages 203 of plurality of mechanical chuck means 202, . . . , increase in the size of the workpiece will cause occurrence of bowing at the workpiece, reducing chuck reliability. This increases the likelihood of occurrence of workpiece droppage, breakage, cracking, chipping and/or other such problems during transport and flipping to reverse front and back sides thereof. And where the workpiece was already bowed at the outset, chucking is made all the more difficult.

Furthermore, because chucking is carried out by way of sliding shaft 207, there is a concern that particles will be generated by the sliding shaft and/or components coming into sliding contact therewith as well as components carrying out rotary driving. And because there are many mechanical parts and apparatus constitution is complex, not only is failure likely to occur and much labor expended during servicing thereof, but the apparatus also tends to be large in size.

In addition, where a vacuum chuck or electrostatic chuck is employed instead of a mechanical chuck, a possibility exists that generation of static electricity will affect the workpiece and/or the process.

The present invention was conceived in light of such issues, it being an object thereof to provide a workpiece transport apparatus capable of definitively flipping workpiece(s) without occurrence of workpiece droppage, breakage, cracking, chipping and/or the like during transport and/or flipping to reverse front and back sides thereof, capable of reducing the number of mechanical parts to a minimum, simplifying servicing procedures, and increasing the compactness of the apparatus; and capable of definitively preventing workpiece(s) and/or process(es) from being adversely affected by static electricity.

SUMMARY OF INVENTION

In order to achieve the foregoing and/or other objects, one or more embodiments of the present invention may comprise at least one pair of transport stages disposed so as to face one another in at least one vertical direction and employing fluidic expulsion and/or simultaneous expulsion and suction to lift in floating fashion and transport one or more workpieces; at least one plurality of elevator pins capable of being raised and lowered, disposed on at least one member of the at least one pair of transport stages, and retaining at least one periphery of at least one of the workpiece or workpieces; and one or more rotating mechanisms for rotating the at least one pair of transport stages so as to permit same to be inverted vertically. Moreover, the at least one workpiece may be transferred from at least one upper member of the at least one pair of transport stages to at least one lower member thereof in accompaniment to lowering of the respective elevator pins at the at least one upper member of the at least one pair of transport stages when the at least one upper member of the at least one pair of transport stages is inverted vertically by at least one of the rotating mechanism or mechanisms.

As a result of such specific features, workpiece(s) lifted in floating fashion at one transport stage or set of transport stages by fluidic expulsion and/or simultaneous expulsion and suction is/are rotated by rotating mechanism(s) and pair(s) of transport stages is/are inverted vertically while periphery or peripheries thereof is/are retained as a result of raising of elevator pin(s); following which lowering of respective elevator pin(s) causes, in accompaniment to such lowering, workpiece(s) to be transferred from one transport stage or set of transport stages at upper location(s) to other transport stage or set of transport stages at lower location(s) such that workpiece(s) is/are lifted in floating fashion by fluidic expulsion and/or simultaneous expulsion and suction at the other transport stage or set of transport stages. As a result, even where increased size of workpiece(s) causes occurrence of bowing at workpiece(s) and/or where workpiece(s) was/were already bowed at the outset, workpiece(s) lifted in floating fashion at one transport stage or set of transport stages by fluidic expulsion and/or simultaneous expulsion and suction is/are smoothly flipped so as to reverse front and back sides thereof while periphery or peripheries thereof is/are retained as a result of raising of elevator pin(s); following which lowering of respective elevator pin(s) at upper transport stage(s) is accompanied by transfer of workpiece(s) from upper transport stage(s) to lower transport stage(s) such that workpiece(s) is/are lifted in floating fashion thereabove, making it possible to definitively prevent occurrence of workpiece droppage, breakage, cracking, chipping and/or the like during transport and/or flipping to reverse front and back sides thereof.

Furthermore, chucking of workpiece(s) being carried out by merely causing simple elevator-type action(s) implemented by elevator pin(s), generation of particles from surrounding regions is held to a minimum. And not only can the number of mechanical parts be reduced, failure be made unlikely to occur, and less labor be expended during servicing thereof, but the apparatus can also be made extremely compact in size.

In addition, workpiece(s) and/or process(es) are not adversely affected by static electricity such as would be the case where a vacuum chuck or electrostatic chuck is employed.

Furthermore, in accordance with another approach, one or more embodiments of the present invention may comprise at least one plurality of transport stages disposed opposite one another in at least one direction in which one or more workpieces is or are transported and employing fluidic expulsion and/or simultaneous expulsion and suction to lift in floating fashion and transport at least one of the workpiece or workpieces; at least one plurality of elevator pins capable of being raised and lowered, disposed on at least a portion of the respective transport stages, and retaining at least one periphery of at least one of the workpiece or workpieces; one or more first rotating mechanisms for rotating at least one of the transport stage or stages which is or are upstream in at least one of the workpiece transport direction or directions to at least one tilt angle less than 180° in at least one direction tending to cause same to be inverted vertically; and one or more second rotating mechanisms for rotating at least one of the transport stage or stages which is or are downstream in at least one of the workpiece transport direction or directions to at least one tilt angle causing same to face, across at least one of the workpiece transport direction or directions, the at least one transport stage which is upstream in the at least one workpiece transport direction and which is rotated by at least one of the first rotating mechanism or mechanisms; wherein at least one of the respective elevator pins which is at at least one location corresponding to the downstream side in the at least one workpiece transport direction of the at least one transport stage that is upstream in the at least one workpiece transport direction, and at least one of the respective elevator pins which is at at least one location corresponding to the upstream side in the at least one workpiece transport direction of the at least one transport stage that is downstream in the at least one workpiece transport direction, are controlled so as to engage in elevator-type action separately from one or more others of the respective elevator pins. Moreover, the at least one workpiece may be made to glide substantially under the force of its own weight so as to be transferred from the at least one transport stage that is upstream in the at least one workpiece transport direction to the at least one transport stage that is downstream in the at least one workpiece transport direction in accompaniment to lowering of at least one elevator pin at the downstream side in the at least one workpiece transport direction of the at least one transport stage that is upstream in the at least one workpiece transport direction when the at least one transport stage that is upstream in the at least one workpiece transport direction is rotated in the at least one direction tending to cause same to be inverted vertically by the at least one first rotating mechanism and lowering of at least one elevator pin at the upstream side in the at least one workpiece transport direction of the at least one transport stage that is downstream in the at least one workpiece transport direction when the at least one transport stage that is downstream in the at least one workpiece transport direction is rotated by the at least one second rotating mechanism.

As a result of such specific features, workpiece(s) lifted in floating fashion at transport stage(s) upstream in workpiece transport direction(s) by fluidic expulsion and/or simultaneous expulsion and suction is/are rotated by first rotating mechanism(s) to angle(s) less than 180° in direction(s) tending to cause same to be inverted vertically, tilting transport stage(s) upstream in workpiece transport direction(s), while periphery or peripheries thereof is/are retained as a result of raising of elevator pin(s); following which lowering of elevator pin(s) at downstream side(s) in workpiece transport direction(s) of transport stage(s) upstream in workpiece transport direction(s) and lowering of elevator pin(s) at upstream side(s) in workpiece transport direction(s) of transport stage(s) downstream in workpiece transport direction(s) causes, in accompaniment to such lowering, workpiece(s) to glide substantially under its/their own weight(s) so as to be transferred from transport stage(s) upstream in workpiece transport direction(s) to transport stage(s) downstream in workpiece transport direction(s) such that workpiece(s) is/are lifted in floating fashion by fluidic expulsion and/or simultaneous expulsion and suction at the transport stage(s) downstream in workpiece transport direction(s). As a result, even where increased size of workpiece(s) causes occurrence of bowing at workpiece(s) and/or where workpiece(s) was/were already bowed at the outset, workpiece(s) lifted in floating fashion at transport stage(s) upstream in workpiece transport direction(s) by fluidic expulsion and/or simultaneous expulsion and suction is/are smoothly flipped so as to reverse front and back sides thereof while periphery or peripheries thereof is/are retained as a result of raising of elevator pin(s); following which lowering of elevator pin(s) at downstream side(s) in workpiece transport direction(s) of transport stage(s) upstream in workpiece transport direction(s) and lowering of elevator pin(s) at upstream side(s) in workpiece transport direction(s) of transport stage(s) downstream in workpiece transport direction(s) is accompanied by gliding transfer of workpiece(s) from transport stage(s) upstream in workpiece transport direction(s) to transport stage(s) downstream in workpiece transport direction(s) such that workpiece(s) is/are lifted in floating fashion thereabove, making it possible to definitively prevent occurrence of workpiece droppage, breakage, cracking, chipping and/or the like during transport and/or flipping to reverse front and back sides thereof.

Furthermore, chucking of workpiece(s) may be carried out by merely causing simple elevator-type action(s) implemented by elevator pin(s), making it possible to hold generation of particles from surrounding regions to a minimum; and the number of mechanical parts may be reduced to a minimum, permitting reduction in the frequency of failures, permitting simplification of servicing procedures, and allowing the apparatus to be made more compact.

In addition, it will be possible to definitively prevent workpiece(s) and/or process(es) from being adversely affected by occurrence of static electricity.

Here, if at least a portion of the respective elevator pins is or are at least partially coated with vibration-dampening material and/or cushioning material having rubber, resin, and/or gel-like silicone as primary component, it will be possible to cause periphery or peripheries of workpiece(s) to be more definitively retained by elevator pin(s) during flipping of workpiece(s) to reverse front and back sides thereof, making it possible to more definitively prevent occurrence of workpiece droppage, breakage, cracking, chipping and/or the like during transport and/or flipping to reverse front and back sides thereof. And it will also be possible to prevent damage to workpiece(s) due to contact during retention of periphery or peripheries of workpiece(s) by respective elevator pin(s).

Furthermore, in accordance with another approach, one or more embodiments of the present invention may comprise at least one pair of transport stages disposed so as to face one another in at least one vertical direction and employing fluidic expulsion and/or simultaneous expulsion and suction to lift in floating fashion and transport one or more workpieces; and one or more rotating mechanisms for rotating the at least one pair of transport stages so as to permit same to be inverted vertically while at least one of the workpiece or workpieces is held by fluidic suction to at least one member of the at least one pair of transport stages. Moreover, the at least one workpiece may be transferred from at least one upper member of the at least one pair of transport stages to at least one lower member thereof in accompaniment to reduction, termination, and/or reversal of fluidic suction when the at least one upper member of the at least one pair of transport stages is inverted vertically by at least one of the rotating mechanism or mechanisms.

As a result of such specific features, workpiece(s) lifted in floating fashion at one transport stage or set of transport stages by fluidic expulsion and/or simultaneous expulsion and suction is/are rotated by rotating mechanism(s) and pair(s) of transport stages is/are inverted vertically while workpiece(s) is/are held by fluidic suction to the one transport stage or set of transport stages; following which reduction, termination, and/or reversal of fluidic suction from one transport stage or set of transport stages now occupying upper location(s) causes, in accompaniment to such reduction, termination, and/or reversal of suction, workpiece(s) to be transferred from one transport stage or set of transport stages at upper location(s) to other transport stage or set of transport stages at lower location(s) such that workpiece(s) is/are lifted in floating fashion by fluidic expulsion and/or simultaneous expulsion and suction at the other transport stage or set of transport stages. As a result, even where increased size of workpiece(s) causes occurrence of bowing at workpiece(s) and/or where workpiece(s) was/were already bowed at the outset, workpiece(s) lifted in floating fashion at one transport stage or set of transport stages by fluidic expulsion and/or simultaneous expulsion and suction is/are smoothly flipped so as to reverse front and back sides thereof while workpiece(s) is/are held by fluidic suction to the one transport stage or set of transport stages; following which reduction, termination, and/or reversal of fluidic suction at one transport stage or set of transport stages now occupying upper location(s) is accompanied by transfer of workpiece(s) from one transport stage or set of transport stages to other transport stage or set of transport stages at lower location(s) such that workpiece(s) is/are lifted in floating fashion thereabove, making it possible to definitively prevent occurrence of workpiece droppage, breakage, cracking, chipping and/or the like during transport and/or flipping to reverse front and back sides thereof.

Furthermore, it being possible to carry out chucking of workpiece(s) by mere fluidic suction, and chucking of workpiece(s) by mechanical part(s) being unnecessary, it is possible to reduce generation of particles to the maximum extent and it is possible to eliminate mechanical parts, simplify servicing procedures, and make the apparatus more compact.

Moreover, if at least a portion of the respective transport stages is or are supported so as to permit horizontal and vertical movement, it will be possible to definitively prevent interference between transport stage(s) and nearby component(s) as transport stage(s) is/are rotated during flipping of workpiece(s) to reverse front and back sides thereof, making it possible to smoothly carry out flipping of workpiece(s) to reverse front and back sides thereof.

DESCRIPTION OF PREFERRED EMBODIMENTS

Below, embodiments of the present invention are described with reference to the drawings.

First Embodiment

Figure 1:
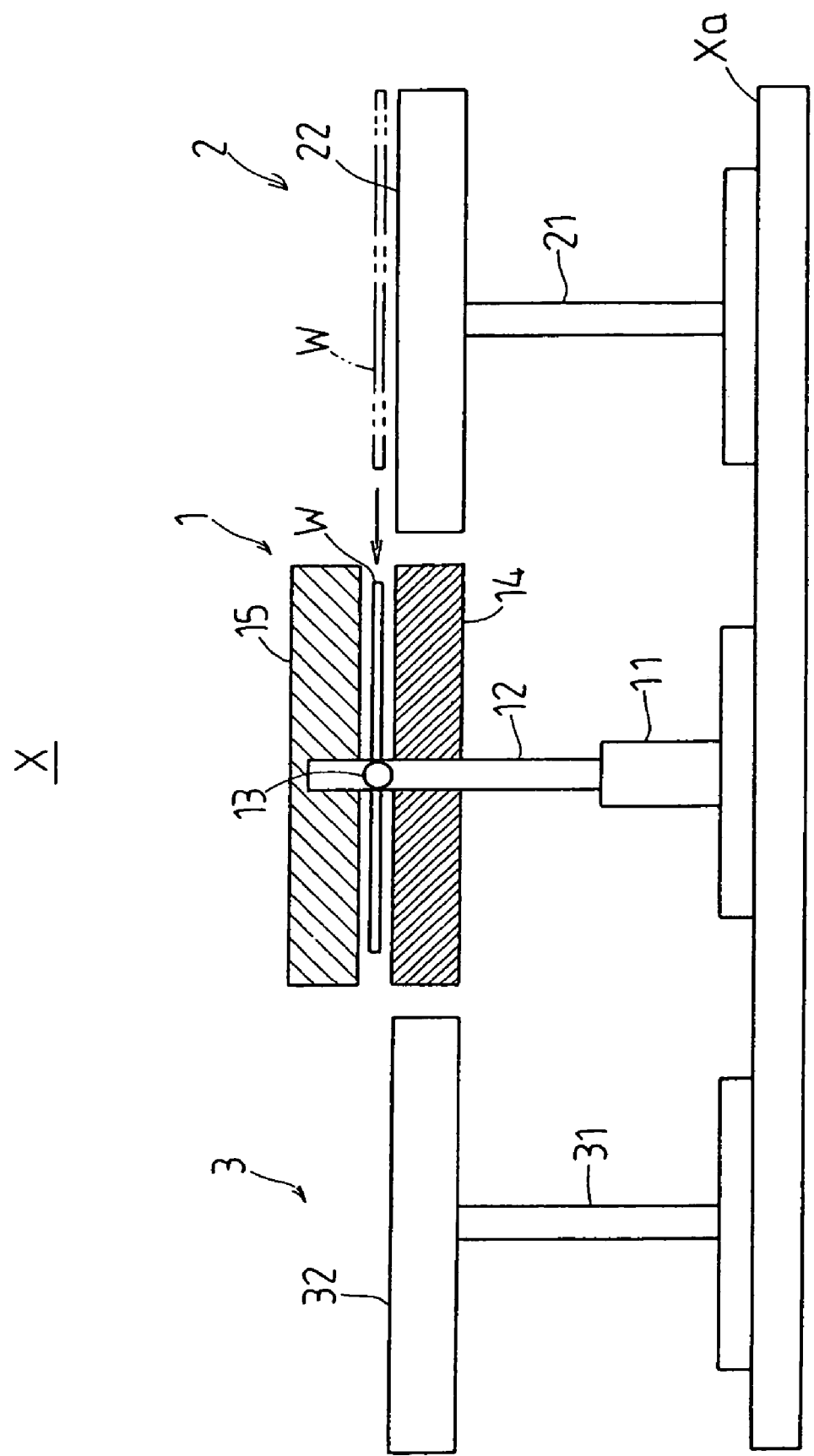
FIG. 1 is a side view of a workpiece transport apparatus associated with a first embodiment of the present invention, transport of a workpiece from a workpiece introduction region to a workpiece rotation region being shown.
Figure 2:
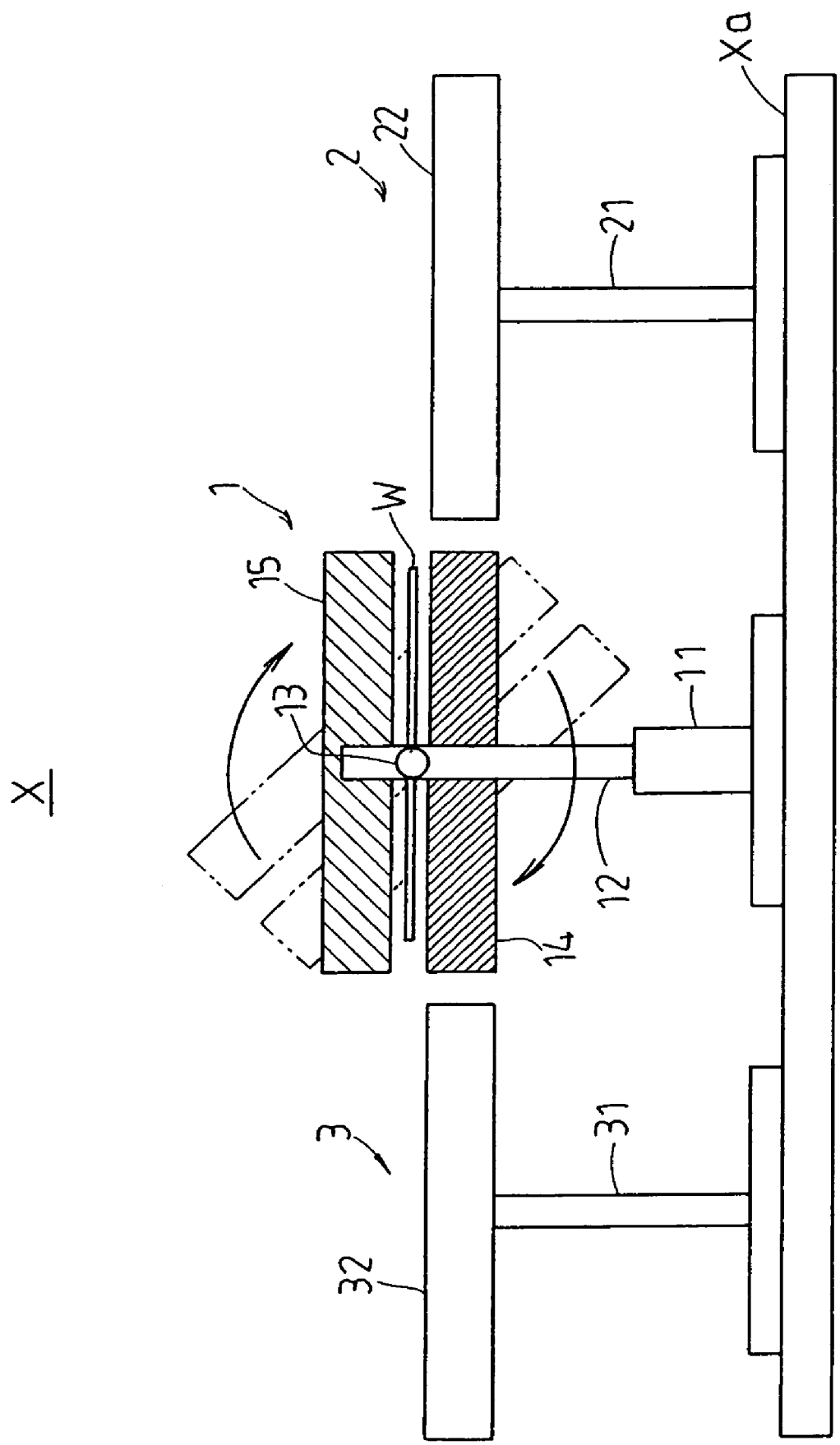
FIG. 2 is a side view of the workpiece transport apparatus therein, flipping of the workpiece at the workpiece rotation region so as to reverse front and back sides thereof being shown.
Figure 3:
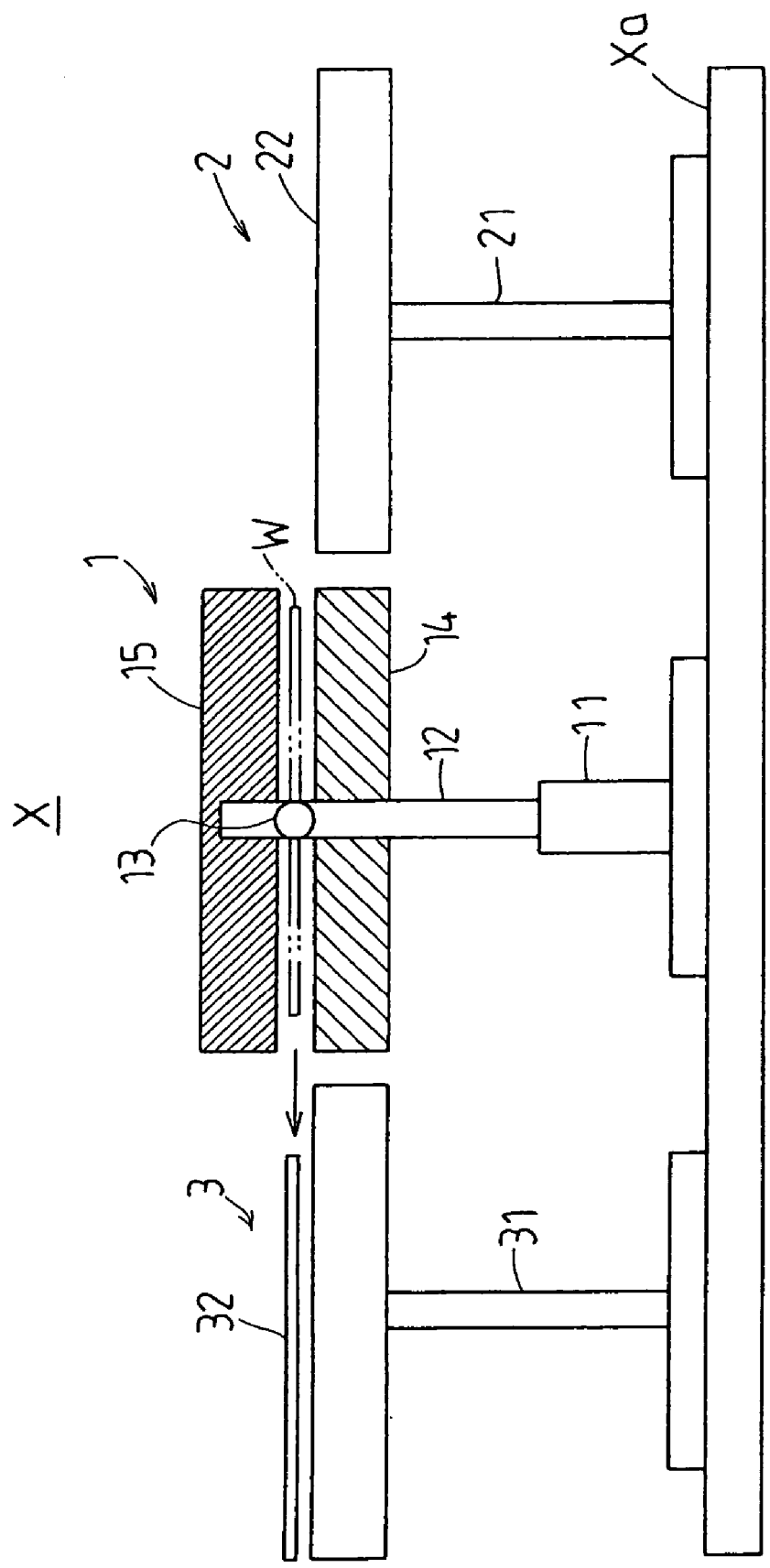
FIG. 3 is a side view of the workpiece transport apparatus therein, transport of the workpiece from the workpiece rotation region to a workpiece exit region being shown.

FIGS. 1 through 3 show workpiece transport apparatus X associated with a first embodiment of the present invention. Arranged so as to be lined up in a single row over platform Xa are workpiece rotation region 1, which flips workpiece W so as to reverse front and back sides thereof; workpiece introduction region 2, which transports workpiece W to workpiece rotation region 1; and workpiece exit region 3, to which workpiece W is transported from workpiece rotation region 1. In the present case, glass substrate(s), semiconductor wafer(s), and/or other such more or less rectangular object(s) in connection with manufacture of semiconductor, liquid crystal display element, EL, PDP and/or other such flat panel display, solar cell panel, and/or the like may be employed as workpiece(s) W.

Figure 4:
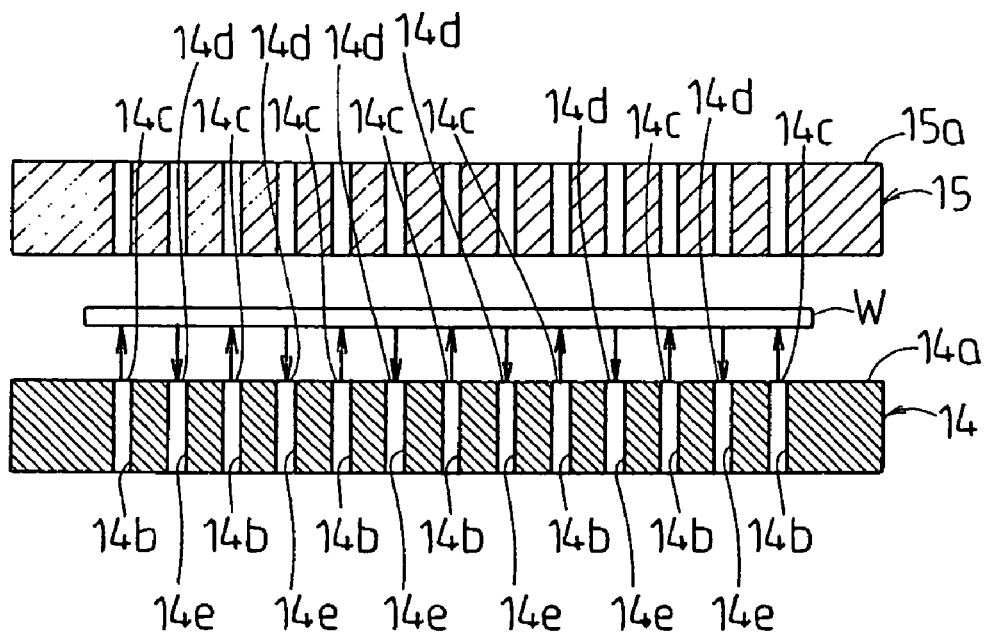
FIG. 4 is a side view of the workpiece rotation region therein, lifting of the workpiece in floating fashion as it is transported thereto from the workpiece introduction region being shown.

The foregoing workpiece rotation region 1 is equipped with pair of left and right support legs 11 (only that at the foreground in the plane of the paper being shown in FIGS. 1 through 3) installed over platform Xa; extensible shafts 12 capable of being vertically extended from and retracted into these support legs 11; and pair of first and second, or upper and lower, transport stages 14, 15 rotatably supported at the tips of such extensible shafts 12 by way of pivot shaft 13. This pivot shaft 13 and a motor, not shown, constitute a rotating mechanism which causes rotation of pair of first and second, or upper and lower, transport stages 14, 15. In addition, the foregoing first and second transport stages 14, 15 are disposed so as to face one another in the vertical direction. Disposed in alternating fashion so as not to mutually crowd each other in region(s) near the centers of mutually facing surfaces 14a, 15a—presenting more or less rectangular appearances in plan view—of such first and second transport stages 14, 15 are plurality of gas expulsion orifices 14c, 15c which expel gas supplied by way of supply passages 14b, 15b (shown in FIGS. 4 through 7) from gas supply tank(s) or canister(s), not shown; and plurality of gas suction orifices 14d, 15d which suck gas expelled from such respective gas expulsion orifices 14c, 15c. Furthermore, as shown in FIGS. 4 through 7, gas expelled from the foregoing respective gas expulsion orifices 14c, 15c strikes workpiece W and is thereafter sucked into respective gas suction orifices 14d, 15d, being discharged by way of suction passages 14e, 15e to the exterior of the apparatus by means of exhaust pump(s) and/or blower(s), not shown. Here, striking of workpiece W by gas expelled from respective gas expulsion orifices 14c, 15c imparts lift to workpiece W, and workpiece W is lifted in floating fashion. Furthermore, whether workpiece W is as shown in FIG. 4 struck only by gas expelled from respective gas expulsion orifices 14c of first transport stage 14 (facing surface 14a) at the lower location, or whether workpiece W is as shown in FIG. 7 struck only by gas expelled from respective gas expulsion orifices 15c of second transport stage 15 (facing surface 15a) at the lower location, lift is imparted to workpiece W and workpiece W is lifted in floating fashion.

Figure 8:
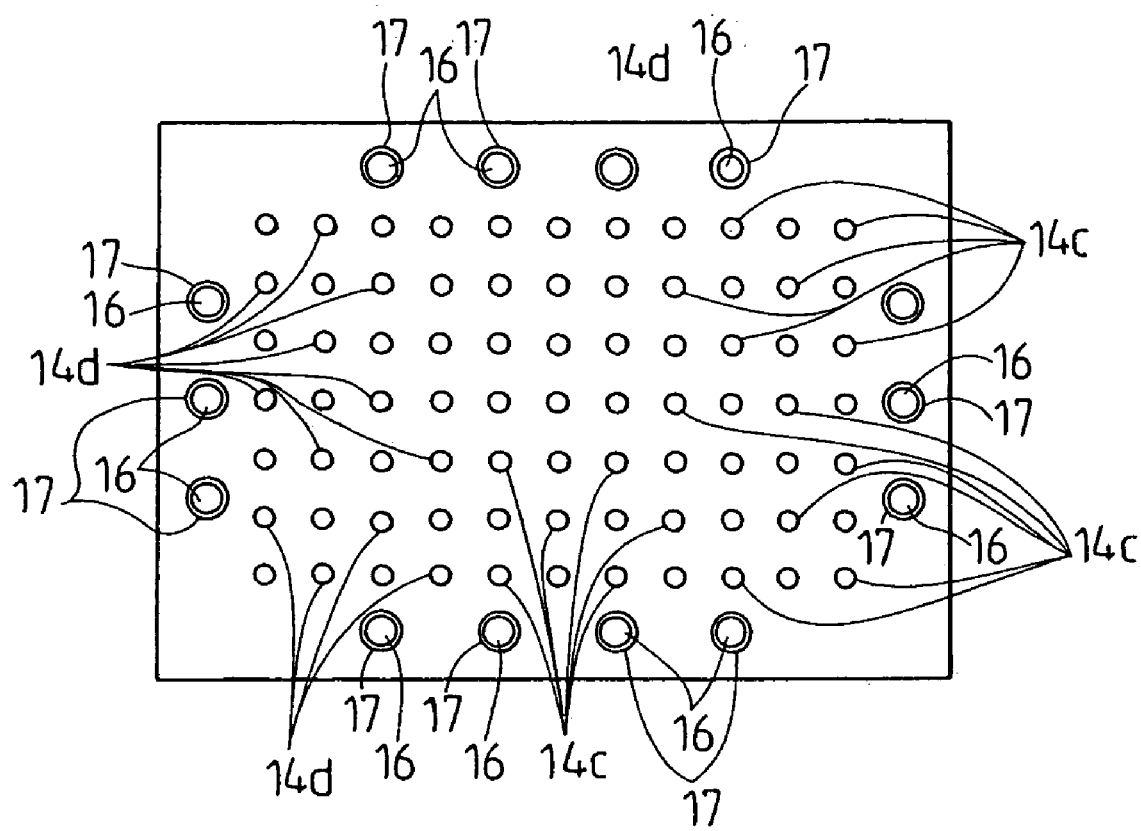
FIG. 8 is a plan view of the first transport stage therein, shown as viewed from the facing surface.
Figure 9:
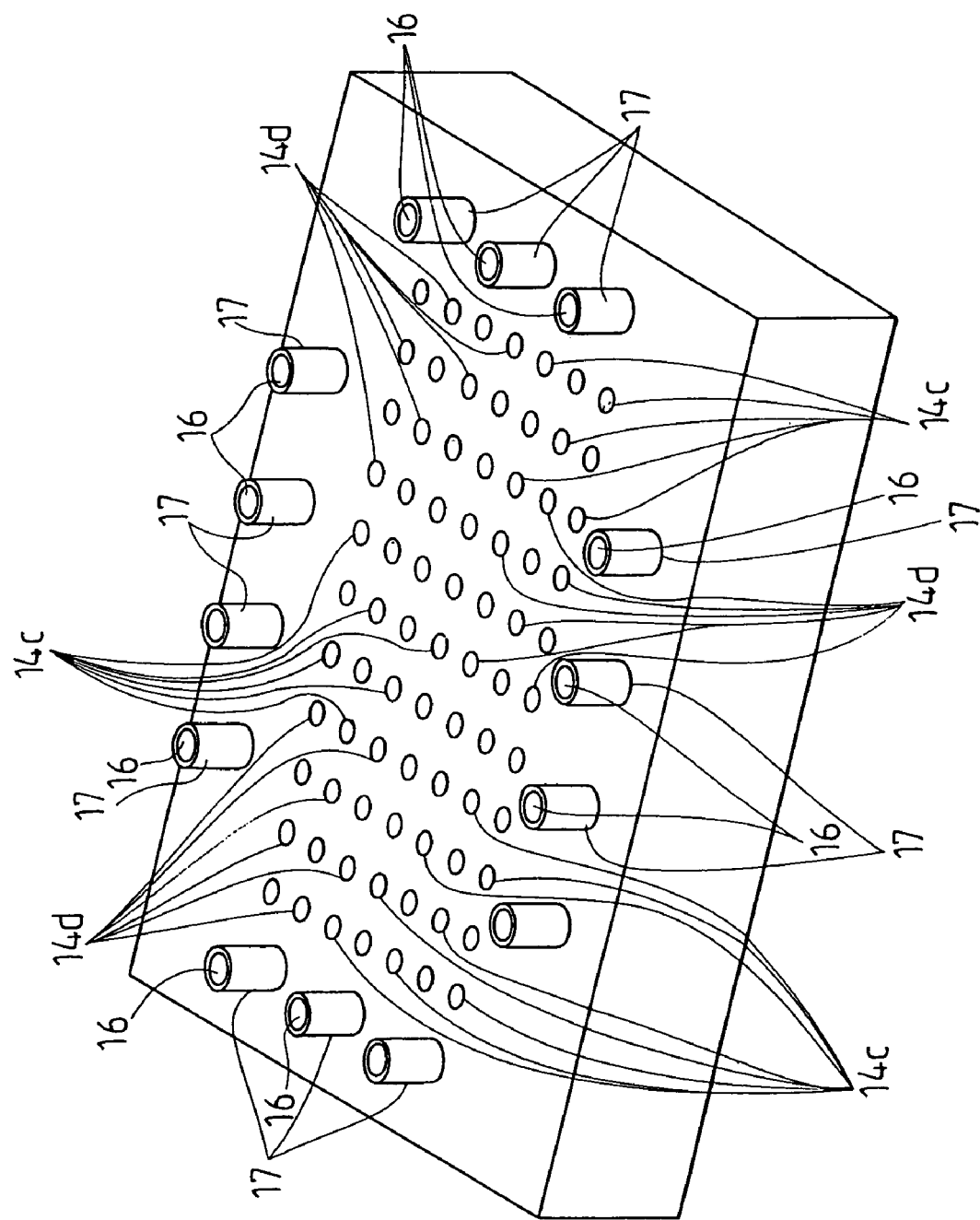
FIG. 9 is an oblique view of the first transport stage therein, shown as viewed diagonally above the facing surface.

Moreover, as shown in FIGS. 8 and 9, disposed with prescribed pitch therebetween in the circumferential direction around the region near the center of facing surface 14a of the foregoing first transport stage 14, i.e., at the periphery of respective gas expulsion orifices 14c and respective gas suction orifices 14d, are plurality of elevator pins 16, . . . capable of being raised and lowered. Such elevator pins 16 are raised and lowered by means of actuator(s), not shown; and when raised, retain the periphery of workpiece W which is lifted in floating fashion above first transport stage 14. The circumferential surfaces of the foregoing elevator pins 16 are coated with cushioning material 17 having rubber, resin, and/or gel-like silicone as primary component. Furthermore, mating holes (not shown) mating with the tips of the foregoing respective elevator pins 16 are disposed in recessed fashion in correspondence to such respective elevator pins 16 around the region near the center of facing surface 15a of the foregoing second transport stage 15, i.e., at the periphery of respective gas expulsion orifices 15c and respective gas suction orifices 15d.

Furthermore, as shown in FIGS. 1 through 3, the foregoing workpiece introduction region 2 is equipped with pair of left and right support legs 21 (only that at the foreground in the plane of the paper being shown in FIGS. 1 through 3) installed over platform Xa; and introduction stage 22, which is secured to the tips of such respective support legs 21. Moreover, the foregoing workpiece exit region 3 is equipped with pair of left and right support legs 31 (only that at the foreground in the plane of the paper being shown in FIGS. 1 through 3) installed over platform Xa; and exit stage 32, which is secured to the tips of such respective support legs 31. At the foregoing introduction stage 22 and exit stage 32 as well, plurality of gas expulsion orifices (not shown) which expel gas supplied by way of supply passages (not shown) from gas supply tank(s) or canister(s), not shown; and plurality of gas suction orifices (not shown) which suck gas expelled from such respective gas expulsion orifices, are disposed in alternating fashion so as not to mutually crowd each other. Moreover, gas expelled from the foregoing respective gas expulsion orifices strikes workpiece W and is thereafter sucked into respective gas suction orifices, being discharged by way of suction passages (not shown) to the exterior of the apparatus by means of exhaust pump(s) and/or blower(s), not shown. Here as well, striking of workpiece W by gas expelled from respective gas expulsion orifices imparts lift to workpiece W, and workpiece W is lifted in floating fashion. Note that it is also possible to impart lift to workpiece W and cause workpiece W to be lifted in floating fashion by causing workpiece W to be struck only by gas expelled from respective gas expulsion orifices of introduction stage 22 and exit stage 32.

A procedure by which workpiece W after being transported from introduction stage 22 may be flipped so as to reverse front and back sides thereof and may thereafter be transported to exit stage 32 is next described.

First, as shown in FIGS. 1 and 4, after causing gas expelled from respective gas expulsion orifices to strike workpiece W at introduction stage 22 of introduction region 2, suction by respective gas suction orifices causes workpiece W, lifted in floating fashion above introduction stage 22, to be transported to first, or lower, transport stage 14 of workpiece rotation region 1, upon which gas expelled by way of supply passages 14b from respective gas expulsion orifices 14c at this first transport stage 14 (facing surface 14a) is made to strike workpiece W, following which suction from respective gas suction orifices 14d by way of suction passages 14e causes workpiece W to be transferred such that it is lifted in floating fashion at first transport stage 14.

Figure 5:
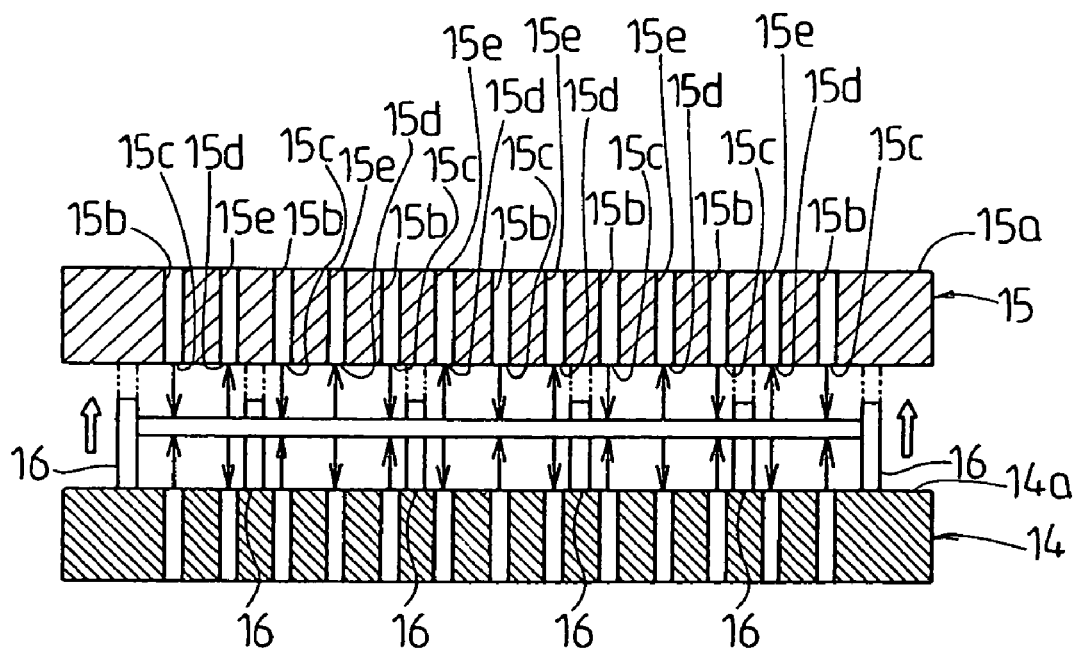
FIG. 5 is a side view of the workpiece rotation region therein, retention of the periphery of the workpiece by elevator pins as the workpiece is lifted in floating fashion between a first and a second transport stage being shown.
Figure 6:
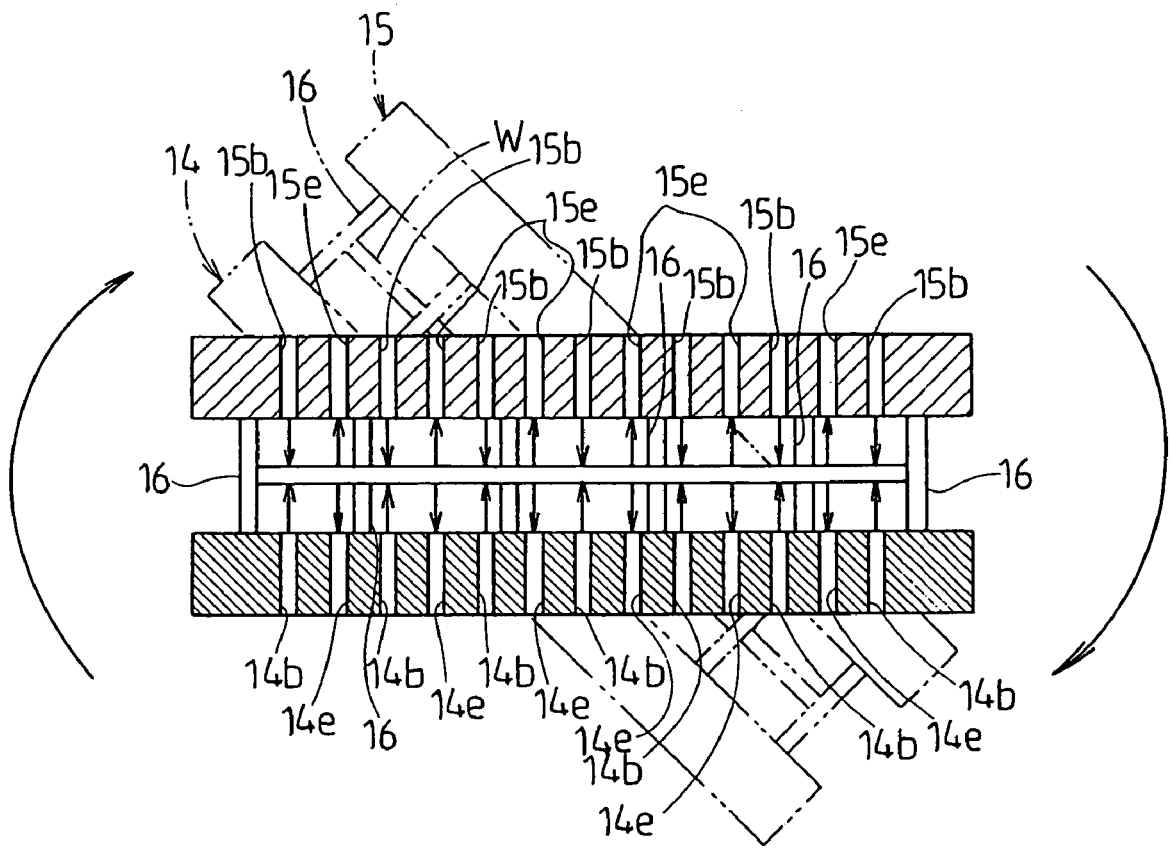
FIG. 6 is a side view of the workpiece rotation region therein, flipping of the workpiece so as to reverse front and back sides thereof as the periphery thereof is retained by elevator pins being shown.
Figure 7:
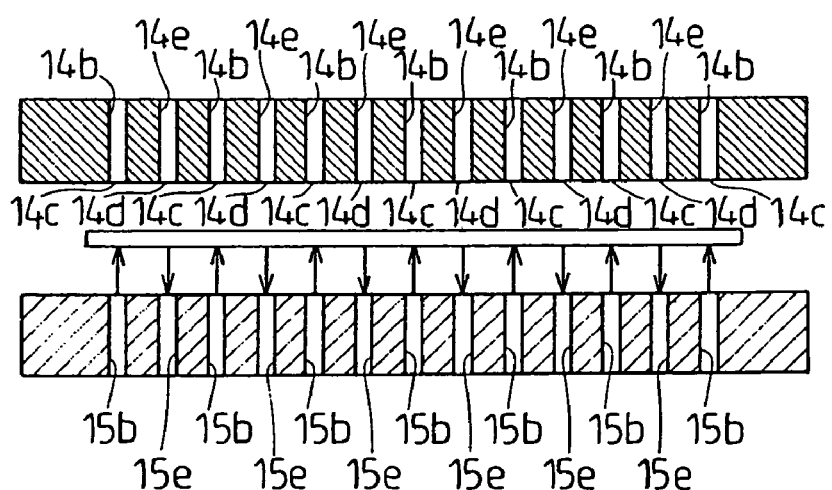
FIG. 7 is a side view of the workpiece rotation region therein, lifting of the workpiece in floating fashion at the second transport stage after the workpiece has been flipped so as to reverse front and back sides thereof being shown.

Next, as shown in FIG. 5, gas expelled by way of respective supply passages 15b from gas expulsion orifices 15c at second, or upper, transport stage 15 (facing surface 15a) is made to strike workpiece W, following which suction from respective gas suction orifices 15d by way of suction passages 15e causes workpiece W to be made to float at a neutral location between first transport stage 14 and second transport stage 15, following which respective elevator pins 16 are raised up from first transport stage 14, the tips of respective elevator pins 16 being respectively made to mate with the mating holes at second transport stage 15 as shown in FIG. 6. At such time, workpiece W is retained due to contact with circumferential surfaces (cushioning material 17) of respective elevator pins 16 while being made to float at a neutral location between first transport stage 14 and second transport stage 15.

Thereafter, as shown in FIG. 2, first and second transport stages 14, 15 are rotated about pivot shaft 13 by 180° clockwise in the plane of the paper at FIG. 6. At such time, in the event that there is a possibility that first and/or second transport stages 14, 15 could interfere with introduction stage 22 and/or exit stage 32 as first and/or second transport stages 14, 15 are rotated about pivot shaft 13, extension of extensible shafts 12 makes it possible to easily avoid interference.

Then, as shown in FIG. 7, respective elevator pins 16 of first transport stage 14 are lowered, and expulsion of gas by way of supply passages 14b from respective gas expulsion orifices 14c and suction of gas by way of suction passages 14e from respective gas suction orifices 14d at first transport stage 14 are terminated, causing workpiece W be transferred to second transport stage 15, which now occupies the lower position, due to expulsion of gas by way of respective supply passages 15b from gas expulsion orifices 15c and suction of gas by way of suction passages 15e from respective gas suction orifices 15d at such second transport stage 15.

Thereafter, workpiece W, lifted in floating fashion above second transport stage 15, is transported to exit stage 32 of exit region 3, and gas expelled from respective gas expulsion orifices at such exit stage 32 is made to strike workpiece W, following which suction by respective gas suction orifices causes workpiece W to be transferred to exit stage 32 such that it is lifted in floating fashion thereabove.

At such time, with second transport stage 15 occupying the lower position and first transport stage 14 occupying the upper position, a subsequent workpiece W from introduction stage 22 of workpiece introduction region 2 would be transported to second transport stage 15 and a similar procedure would be used to flip workpiece W so as to reverse front and back sides thereof and to transfer workpiece W from second transport stage 15 to first transport stage 14, upon which workpiece W would be transported from such first transport stage 14 to exit stage 32 of exit region 3.

In this way, workpiece(s) W lifted in floating fashion at first transport stage 14 by simultaneous expulsion and suction of gas(es) is/are rotated clockwise in the plane of the paper about pivot shaft 13 and pair of first and second transport stages 14, 15 are inverted vertically while periphery or peripheries thereof is/are retained as a result of raising of respective elevator pin(s) 16; following which lowering of respective elevator pin(s) 16 causes, in accompaniment to such lowering, workpiece(s) W to be transferred from first transport stage 14 at upper location(s) to second transport stage 15 at lower location(s) such that workpiece(s) W is/are lifted in floating fashion by simultaneous expulsion and suction of gas(es) at such second transport stage 15. As a result, even where increased size of workpiece(s) W causes occurrence of bowing at workpiece(s) W and/or where workpiece(s) W was/were already bowed at the outset, workpiece(s) W lifted in floating fashion at first transport stage 14 by simultaneous expulsion and suction of gas(es) is/are smoothly flipped so as to reverse front and back sides thereof while periphery or peripheries thereof is/are retained as a result of raising of respective elevator pin(s) 16; following which lowering of respective elevator pin(s) 16 at first transport stage 14 at upper location(s) is accompanied by transfer of workpiece(s) W from such first transport stage 14 to second transport stage 15 at lower location(s) such that workpiece(s) W is/are lifted in floating fashion thereabove, making it possible to definitively prevent occurrence of workpiece W droppage, breakage, cracking, chipping and/or the like during transport and/or flipping to reverse front and back sides thereof.

Furthermore, chucking of workpiece(s) W being carried out by merely causing simple elevator-type action(s) implemented by respective elevator pin(s) 16, generation of particles from surrounding regions can be held to a minimum. And not only can the number of mechanical parts be reduced, failure be made unlikely to occur, and less labor be expended during servicing thereof, but the apparatus can also be made extremely compact in size.

In addition, workpiece(s) W and/or process(es) are not adversely affected by static electricity such as would be the case where a vacuum chuck or electrostatic chuck is employed, and it is possible to definitively prevent workpiece(s) W and/or process(es) from being adversely affected by static electricity.

Second Embodiment

Next, referring to FIGS. 10 through 13, a second embodiment of the present invention is described.

In the present embodiment, constitutions of first and second transport stages are modified Note that, except for the first and second transport stages, the constitution is in other respects identical to that of the foregoing first embodiment, and like components will be assigned like reference numerals and detailed description thereof will be omitted.

That is, in the present embodiment, as shown in FIGS. 10 through 13, gas expulsion orifices 41c, 42c which expel gas by way of plurality of supply passages 41b, 42b and gas suction orifices 41d, 42d which suck gas by way of plurality of suction passages 41e, 42e are disposed in alternating fashion so as not to mutually crowd each other in region(s) near the centers of facing surfaces 41a, 42a of first and second transport stages 41, 42 of workpiece rotation region 4. Moreover, the constitution is such that there is/are no elevator pin(s) around the region near the center of facing surface 41a of the foregoing first transport stage 41, i.e., at the periphery of respective gas expulsion orifices 41c and respective gas suction orifices 41d.

A procedure by which workpiece W after being transported from introduction stage 22 may be flipped so as to reverse front and back sides thereof and may thereafter be transported to exit stage 32 is next described.

Figure 10:
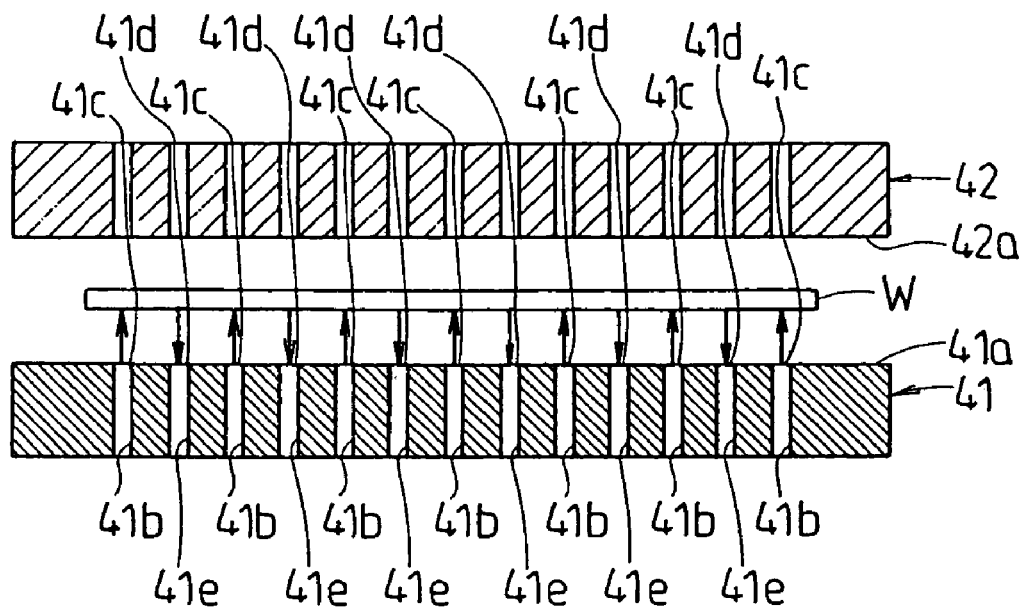
FIG. 10 is a side view of a workpiece rotation region associated with a second embodiment of the present invention, lifting of a workpiece in floating fashion as it is transported thereto from a workpiece introduction region being shown.

First, as shown in FIG. 10, workpiece W, lifted in floating fashion above introduction stage 22 of introduction region 2, is transported to first, or lower, transport stage 41 of workpiece rotation region 1, upon which gas expelled by way of supply passages 41b from respective gas expulsion orifices 41c at this first transport stage 41 (facing surface 41a) is made to strike workpiece W, following which suction from respective gas suction orifices 41d by way of suction passages 41e causes workpiece W to be transferred such that it is lifted in floating fashion at first transport stage 41.

Figure 11:
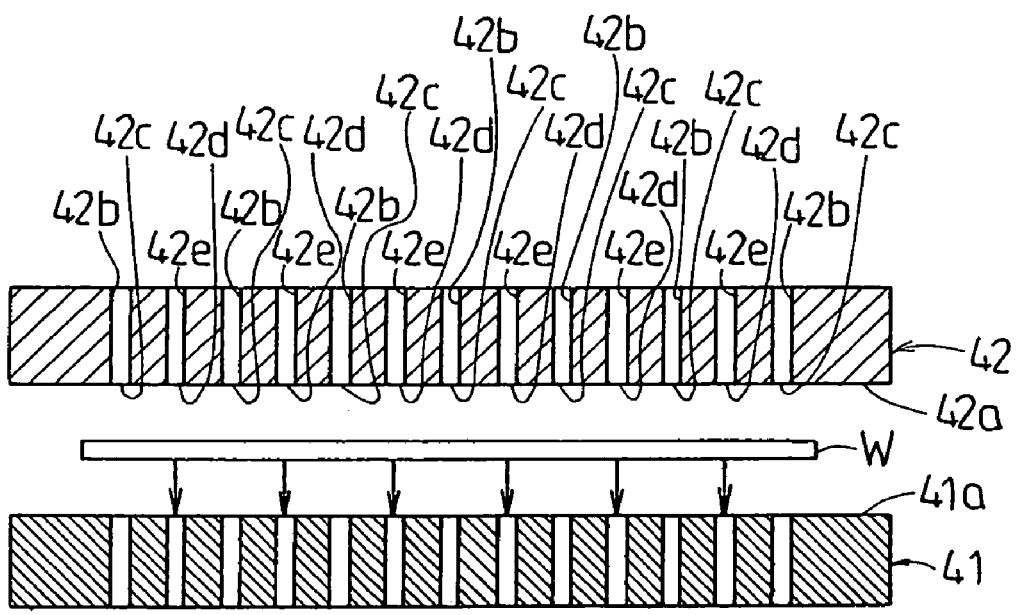
FIG. 11 is a side view of the workpiece rotation region therein, commencement of suction directed at the workpiece by a first transport stage after the workpiece has been lifted in floating fashion between the first and a second workpiece transport stage being shown.

Next, as shown in FIG. 11, expulsion of gas from gas expulsion orifices 41c by way of respective supply passages 41b is terminated, and gas is sucked from respective gas suction orifices 41d by way of suction passages 41e.

Figure 12:
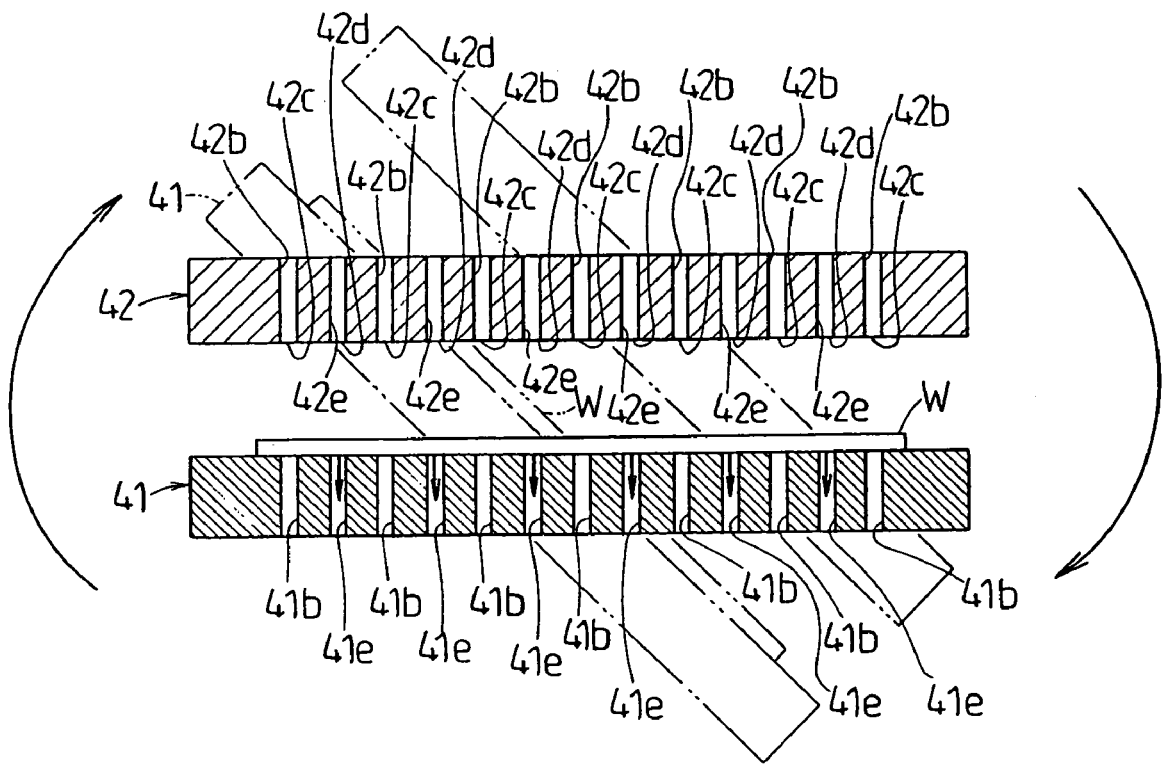
FIG. 12 is a side view of the workpiece rotation region therein, flipping of the workpiece so as to reverse front and back sides thereof as the workpiece is held to the first transport stage being shown.

Thereafter, as shown in FIG. 12, suction of gas from respective gas suction orifices 41d by way of suction passages 41e causes workpiece W to be held against facing surface 41a of first transport stage 41; and with the apparatus in this state, first and second transport stages 41, 42 are rotated about pivot shaft 13 by 180° clockwise in the plane of the paper at FIG. 12. At such time, in the event that there is a possibility that first and/or second transport stages 41, 42 could interfere with introduction stage 22 and/or exit stage 32 as first and/or second transport stages 41, 42 are rotated about pivot shaft 13, extension of extensible shafts 12 makes it possible to easily avoid interference.

Figure 13:
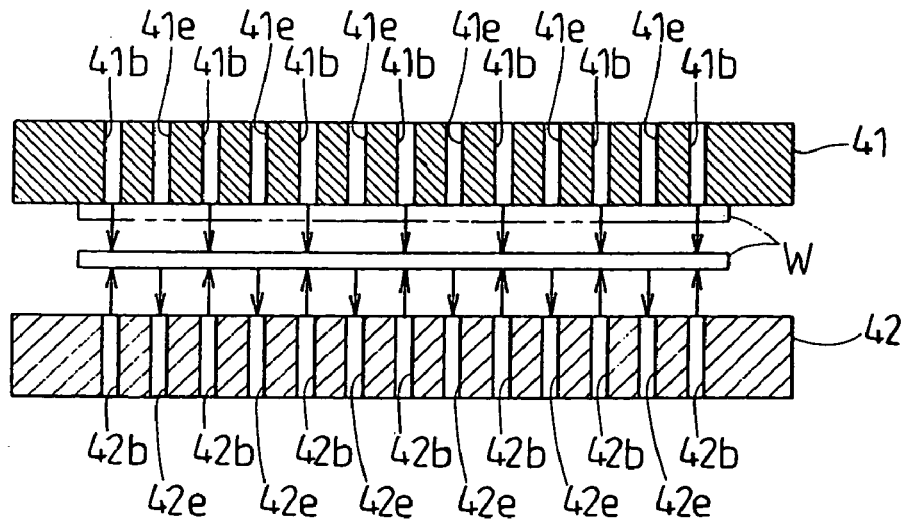
FIG. 13 is a side view of the workpiece rotation region therein, release of the workpiece and lifting thereof in floating fashion between the first and the second transport stage after the workpiece has been flipped so as to reverse front and back sides thereof being shown.

Then, as shown in FIG. 13, suction of gas by way of suction passages 41e from first set of respective gas suction orifices 41d at first transport stage 41, now at the upper location, is terminated, workpiece W is allowed to fall under the force of its own weight, and suction by way of suction passages 42e from respective gas suction orifices 42d as gas expelled from respective gas expulsion orifices 42c by way of supply passages 42b at second transport stage 42 is made to strike workpiece W causes workpiece W to be transferred to second transport stage 42 such that workpiece W is lifted in floating fashion thereabove.

Thereafter, workpiece W, lifted in floating fashion above second transport stage 42, is transported to exit stage 32 of exit region 3, and gas expelled from respective gas expulsion orifices at such exit stage 32 is made to strike workpiece W, following which suction by respective gas suction orifices causes workpiece W to be transferred to exit stage 32 such that it is lifted in floating fashion thereabove.

At such time, with second transport stage 42 occupying the lower position and first transport stage 41 occupying the upper position, a subsequent workpiece W from introduction stage 22 of workpiece introduction region 2 would be transported to second transport stage 42 and a similar procedure would be used to flip workpiece W so as to reverse front and back sides thereof and to transfer workpiece W from second transport stage 42 to first transport stage 41, upon which workpiece W would be transported from such first transport stage 41 to exit stage 32 of exit region 3.

In this way, workpiece(s) W lifted in floating fashion at first transport stage 41 at lower location(s) by simultaneous expulsion and suction of gas(es) is/are rotated clockwise in the plane of the paper about pivot shaft 13 and pair of first and second transport stages 41, 42 are inverted vertically while workpiece(s) W is/are held by gas suction to such first transport stage 41; following which termination of gas suction at first transport stage 41 now occupying upper location(s) causes, in accompaniment to such termination of suction, workpiece(s) W to fall under its/their own weight(s) and to be transferred from first transport stage 41 at upper location(s) to second transport stage 42 at lower location(s) such that workpiece(s) W is/are lifted in floating fashion by simultaneous expulsion and suction of gas(es) at such second transport stage 42. As a result, even where increased size of workpiece(s) W causes occurrence of bowing at workpiece(s) W and/or where workpiece(s) W was/were already bowed at the outset, workpiece(s) W lifted in floating fashion at first transport stage 41 by simultaneous expulsion and suction of gas(es) is/are smoothly flipped so as to reverse front and back sides thereof while workpiece(s) W is/are held by gas suction to facing surface 41a of such first transport stage 41; following which termination of gas suction at first transport stage 41 now occupying upper location(s) is accompanied by transfer of workpiece(s) W, under the force(s) of its/their own weight(s), from first transport stage 41 to second transport stage 42 at lower location(s) such that workpiece(s) W is/are lifted in floating fashion thereabove, making it possible to definitively prevent occurrence of workpiece W droppage, breakage, cracking, chipping and/or the like during transport and/or flipping to reverse front and back sides thereof.

Furthermore, it being possible to carry out chucking of workpiece(s) W by mere fluidic suction, and chucking of workpiece(s) by mechanical part(s) being unnecessary, it is possible to reduce generation of particles to the maximum extent and it is possible to eliminate mechanical parts, simplify servicing procedures, and make the apparatus more compact.

Third Embodiment

Next, referring to FIGS. 14 through 19, a third embodiment of the present invention is described.

In the present embodiment, constitution(s) of workpiece rotation region(s) is/are modified. Note that, except for the workpiece rotation region(s), the constitution is in other respects identical to that of the foregoing first embodiment, and like components will be assigned like reference numerals and detailed description thereof will be omitted.

Figure 14:
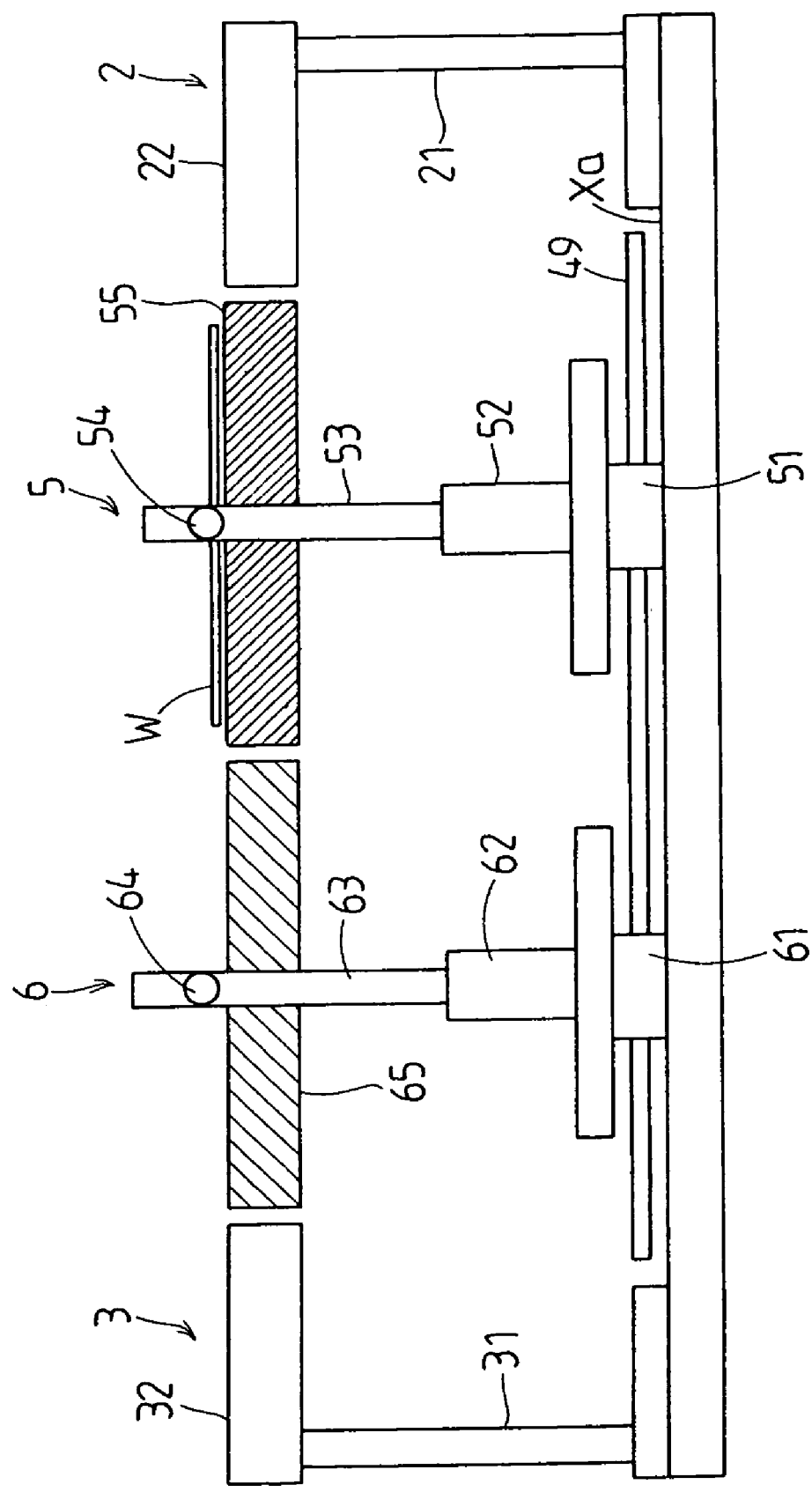
FIG. 14 is a side view of a workpiece transport apparatus associated with a third embodiment of the present invention, transport of a workpiece from a workpiece introduction region to an upstream workpiece rotation region being shown.
Figure 15:
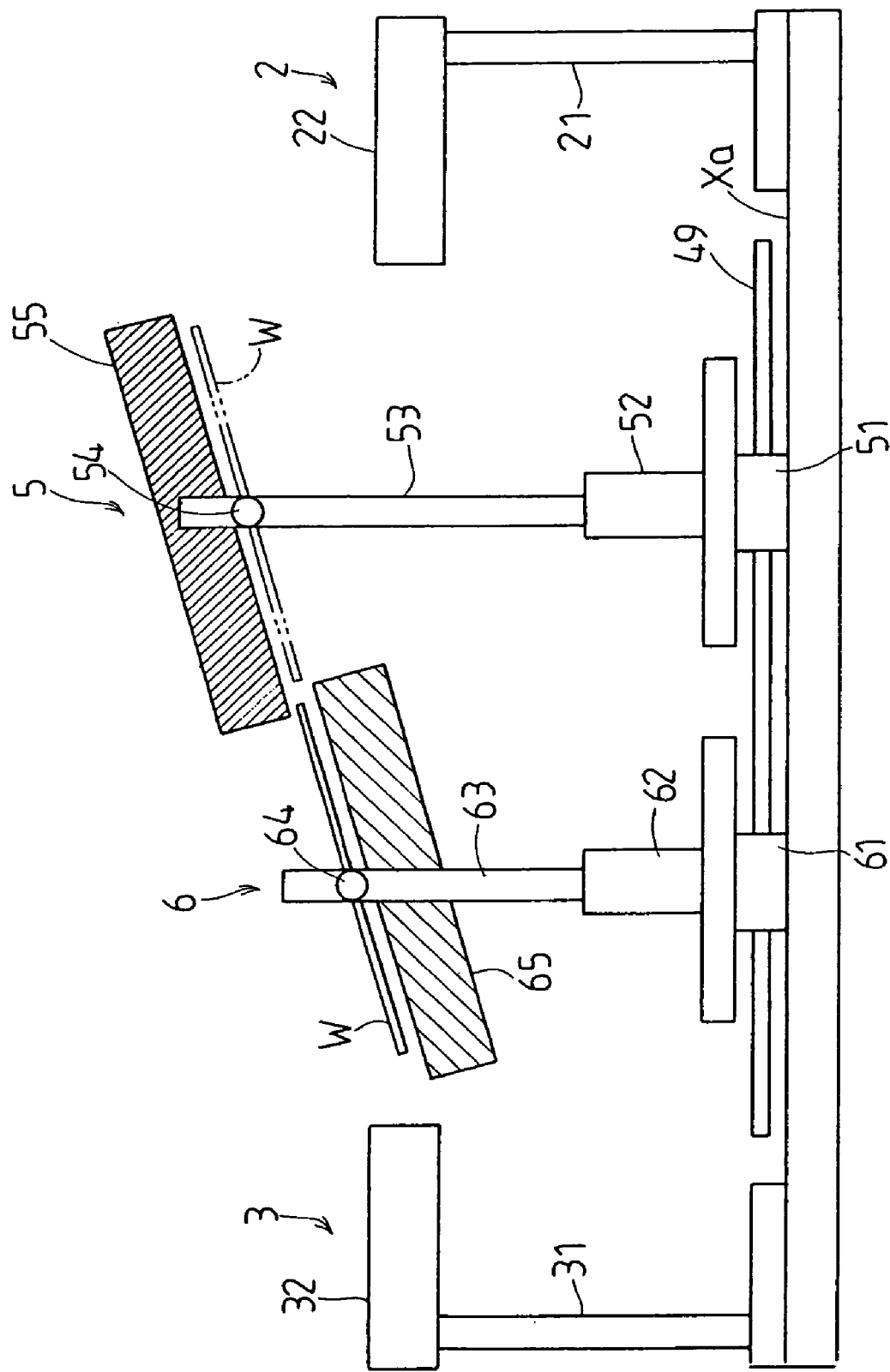
FIG. 15 is a side view of the workpiece transport apparatus therein, transfer of the workpiece from the upstream workpiece rotation region to a downstream workpiece rotation region being shown.

That is, as shown in FIGS. 14 and 15, disposed between workpiece introduction region 2 and workpiece exit region 3 in the present embodiment there are upstream workpiece rotation region 5 which is upstream in the workpiece transport direction, and downstream workpiece rotation region 6 which is downstream in the workpiece transport direction; this upstream workpiece rotation region 5 and this downstream workpiece rotation region 6, as well as this workpiece introduction region 2 and this workpiece exit region 3, being arranged so as to be lined up in a single row over platform Xa.

The foregoing upstream workpiece rotation region 5 is equipped with sliders 51 slidably supported at the upstream side (the right side at FIGS. 14 and 15) in the workpiece transport direction by pair of left and right rails 49 (only that at the foreground in the plane of the paper being shown in FIGS. 14 and 15) extending in the workpiece transport direction and installed over platform Xa; support legs 52 fixed to such sliders 51; extensible shafts 53 capable of being vertically extended from and retracted into such support legs 52; and upstream transport stage 55 which is upstream in the workpiece transport direction and which is rotatably supported at the tips of such extensible shafts 53 by way of pivot shaft 54. This pivot shaft 54 and a motor, not shown, constitute a first rotating mechanism which causes upstream transport stage 55 to be rotated counterclockwise as shown at FIG. 15 about pivot shaft 54 to tilt angle(s) greater than or equal to 135° but less than 180° in direction(s) tending to cause same to be inverted vertically. Furthermore, the foregoing upstream transport stage 55 is supported such that it is capable of sliding in the work transport direction (horizontally at FIGS. 14 and 15) along rails 49 and such that it is capable of being raised and lowered vertically by means of extensible shafts 53.

Moreover, the foregoing downstream workpiece rotation region 6 is equipped with sliders 61 slidably supported at the downstream side (the left side at FIGS. 14 and 16) in the workpiece transport direction by pair of left and right rails 49 extending in the workpiece transport direction and installed over platform Xa; support legs 62 fixed to such sliders 61; extensible shafts 63 capable of being vertically extended from and retracted into such support legs 62; and downstream transport stage 65 which is downstream in the workpiece transport direction and which is rotatably supported at the tips of such extensible shafts 63 by way of pivot shaft 64. This pivot shaft 64 and a motor, not shown, constitute a second rotating mechanism which causes downstream transport stage 65 to be rotated counterclockwise as shown at FIG. 15 about pivot shaft 64 to tilt angle(s) causing same to face, across the workpiece transport direction, upstream transport stage 55 as it exists or would exist after being rotated by the first rotating mechanism (i.e., to tilt angle(s) causing downstream transport stage 65 to become more or less parallel to upstream transport stage 55). Furthermore, the foregoing downstream transport stage 65 is supported such that it is capable of sliding in the work transport direction (horizontally at FIGS. 14 and 15) along rails 49 and such that it is capable of being raised and lowered vertically by means of extensible shafts 63.

The foregoing upstream and downstream transport stages 55, 65 present more or less rectangular appearances in plan view, and disposed in alternating fashion so as not to mutually crowd each other in region(s) near the centers thereof are plurality of gas expulsion orifices 55c, 65c which expel gas supplied by way of supply passages 55b, 65b (shown in FIGS. 16 through 19) from gas supply tank(s) or canister(s), not shown; and plurality of gas suction orifices 55d, 65d which suck gas expelled from such respective gas expulsion orifices 55c, 65c. Furthermore, as shown in FIGS. 16 through 19, gas expelled from the foregoing respective gas expulsion orifices 55c, 65c strikes workpiece W and is thereafter sucked into respective gas suction orifices 55d, 65d, being discharged by way of suction passages 55e, 65e to the exterior of the apparatus by means of exhaust pump(s) and/or blower(s), not shown. Here, striking of workpiece W by gas expelled from respective gas expulsion orifices 55c, 65c imparts lift to workpiece W, and workpiece W is lifted in floating fashion.

Moreover, as shown in FIGS. 8 and 9, disposed with prescribed pitch therebetween in the circumferential direction around the regions near the centers of the foregoing upstream and downstream transport stages 55, 65, i.e., at the periphery of respective gas expulsion orifices 55c, 65c and respective gas suction orifices 55d, 65d are plurality of elevator pins 71, . . . capable of being raised and lowered. Such elevator pins 71 are raised and lowered by means of actuator(s), not shown; and when raised, retain the periphery of workpiece W which is lifted in floating fashion above upstream transport stage 55. The circumferential surfaces of the foregoing elevator pins 71 are coated with cushioning material 72 having rubber, resin, and/or gel-like silicone as primary component. Furthermore, of the foregoing respective elevator pins 71, elevator pin(s) 71 at location(s) corresponding to the downstream side in the workpiece transport direction of upstream transport stage 55, and elevator pin(s) 71 at location(s) corresponding to the upstream side in the workpiece transport direction of downstream transport stage 65, are controlled so as to engage in elevator-type action separately from other respective elevator pin(s) 71; and with the apparatus in a state such that all respective elevator pins 71 are raised, only elevator pin(s) 71 at location(s) corresponding to the downstream side in the workpiece transport direction of upstream transport stage 55 and elevator pin(s) 71 at location(s) corresponding to the upstream side in the workpiece transport direction of downstream transport stage 65 are lowered, thereby forming a transport path opened between the two transport stages 55, 65 so as to permit workpiece W, lifted in floating fashion over upstream transport stage 55, to be transferred to downstream transport stage 65. Moreover, elevator pin(s) 71 other than elevator pin(s) 71 at location(s) corresponding to the upstream side in the workpiece transport direction of downstream transport stage 65 are raised so as to receive workpiece W when workpiece W is transferred from upstream transport stage 55 to downstream transport stage 65.

A procedure by which workpiece W after being transported from introduction stage 22 may be flipped so as to reverse front and back sides thereof and may thereafter be transported to exit stage 32 is next described.

Figure 16:
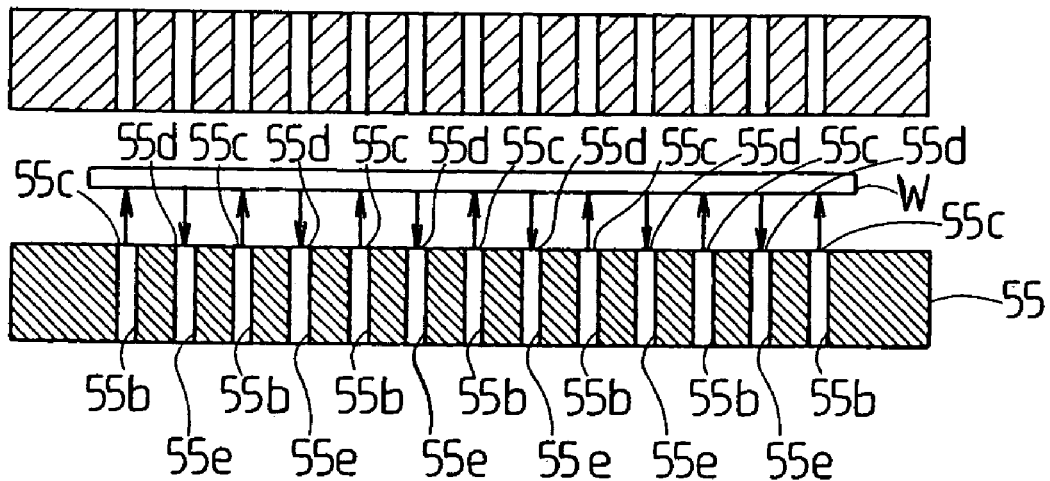
FIG. 16 is a side view of the upstream workpiece rotation region therein, lifting of the workpiece in floating fashion as it is transported thereto from the workpiece introduction region being shown.

First, as shown in FIGS. 14 and 16, after causing gas expelled from respective gas expulsion orifices to strike workpiece W at introduction stage 22 of introduction region 2, suction by respective gas suction orifices causes workpiece W, lifted in floating fashion above introduction stage 22, to be transported to upstream transport stage 55 of upstream workpiece rotation region 5, upon which gas expelled by way of supply passages 55b from respective gas expulsion orifices 55c at this upstream transport stage 55 is made to strike workpiece W, following which suction from respective gas suction orifices 55d by way of suction passages 55e causes workpiece W to be transferred such that it is lifted in floating fashion at upstream transport stage 55.

Figure 17:
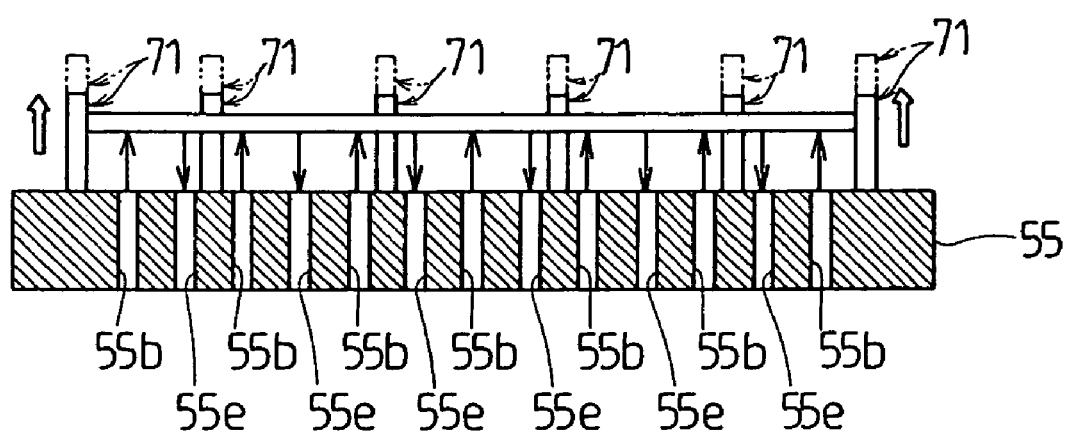
FIG. 17 is a side view of the upstream workpiece rotation region therein, retention of the periphery of the workpiece by elevator pins as the workpiece is lifted in floating fashion being shown.

Next, as shown in FIG. 17, all respective elevator pins 17 are raised up from upstream transport stage 55. At such time, workpiece W is retained due to contact with circumferential surfaces (cushioning material 72) of respective elevator pins 71 while being made to float above upstream transport stage 55.

Figure 18:
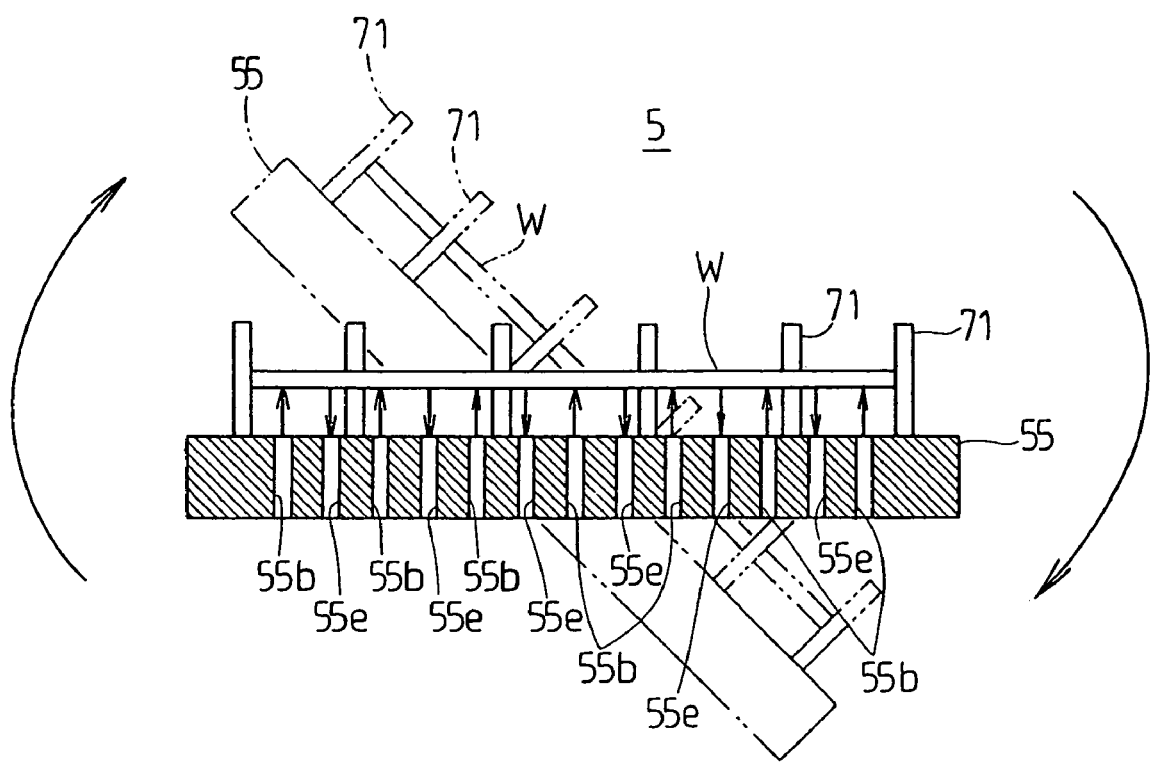
FIG. 18 is a side view of the upstream workpiece rotation region therein, flipping of the workpiece so as to reverse front and back sides thereof as the periphery thereof is retained by elevator pins being shown.

Thereafter, as shown in FIG. 18, upstream transport stage 55 is rotated clockwise in the plane of the paper at FIG. 18 about pivot shaft 54 to a tilt angle greater than or equal to 135° but less than 180°, and downstream transport stage 65 is rotated counterclockwise as shown at FIG. 18 about pivot shaft 64 to a tilt angle causing same to face, across the workpiece transport direction, such rotated upstream transport stage 55 (i.e., to a tilt angle causing downstream transport stage 65 to become more or less parallel to upstream transport stage 55). At such time, in the event that there is a possibility that upstream and downstream transport stages 55, 65 could interfere with each other, and/or that either or both could interfere with introduction stage 22 and/or exit stage 32 as upstream transport stage 55 is rotated about pivot shaft 54 and/or downstream transport stage 65 is rotated about pivot shaft 64, extension of extensible shafts 53, 63 and/or sliding in the transport direction over rails 49 by way of sliders 51, 61 makes it possible to easily avoid interference.

Figure 19:
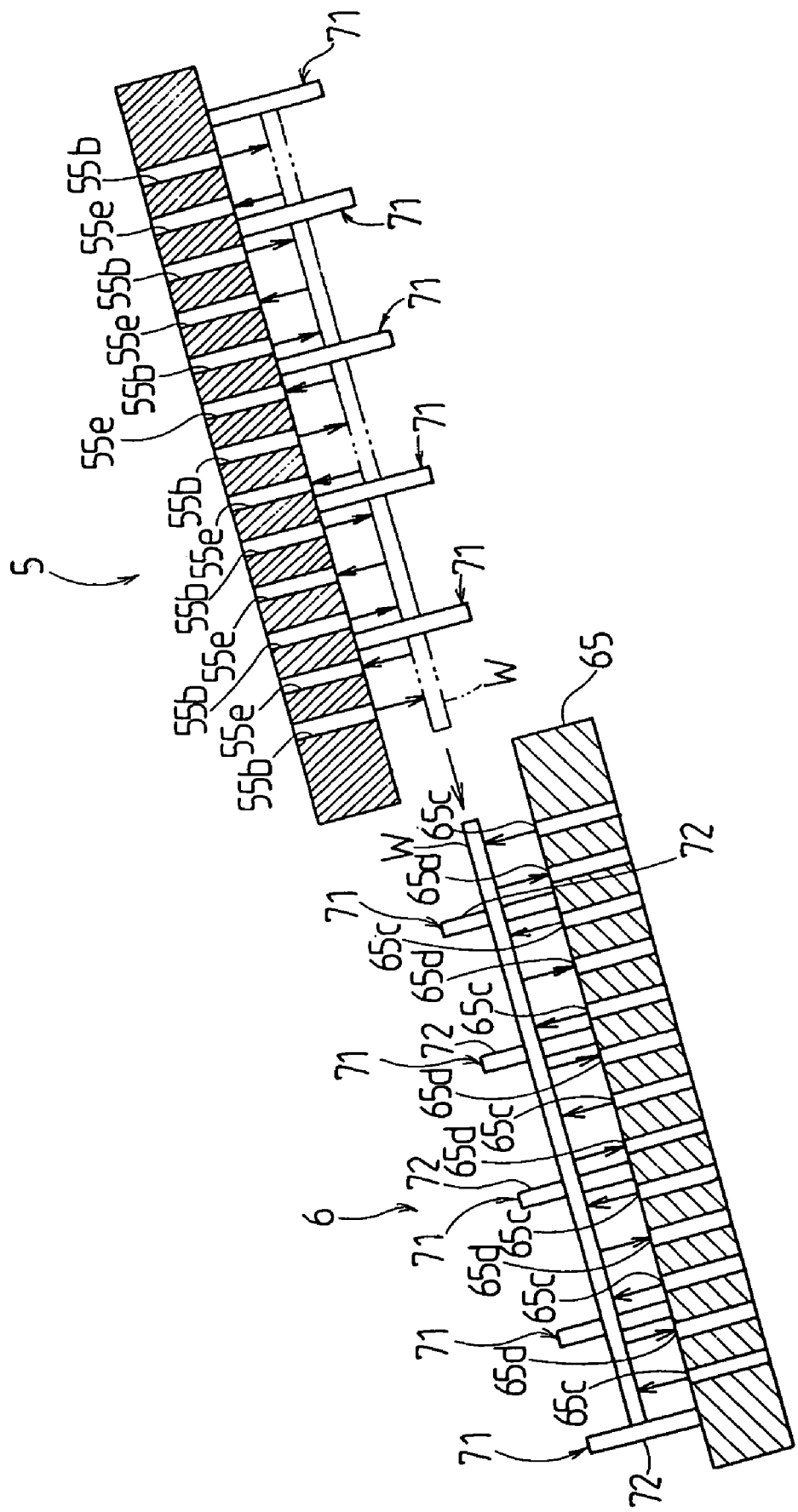
FIG. 19 is a side view, from the upstream workpiece rotation region to the downstream workpiece rotation region therein, transfer of the workpiece from an upstream transport stage to a downstream transport stage being shown.
Figure 20:
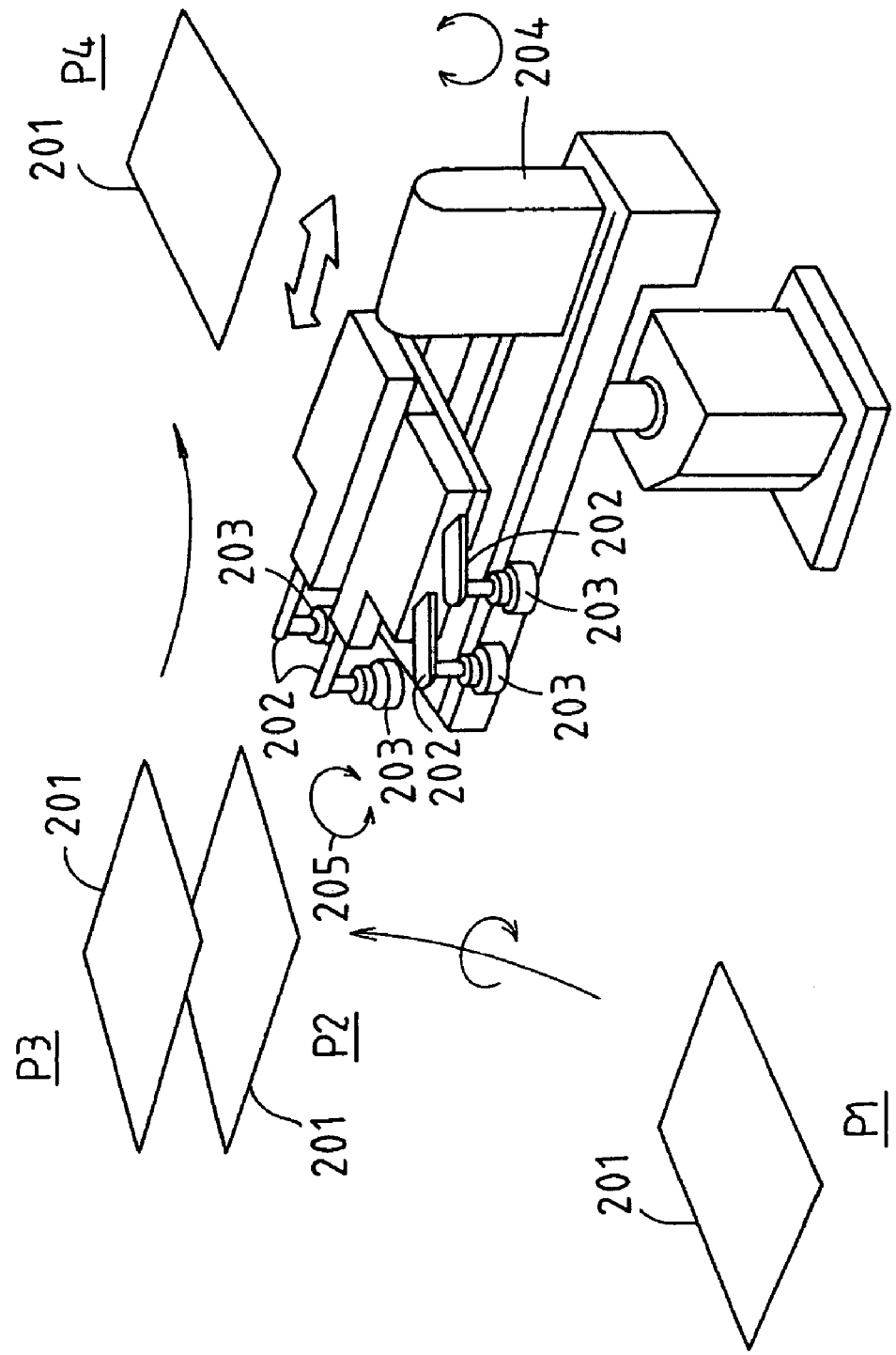
FIG. 20 is an oblique view of a workpiece transport apparatus associated with a conventional example.
Figure 21:
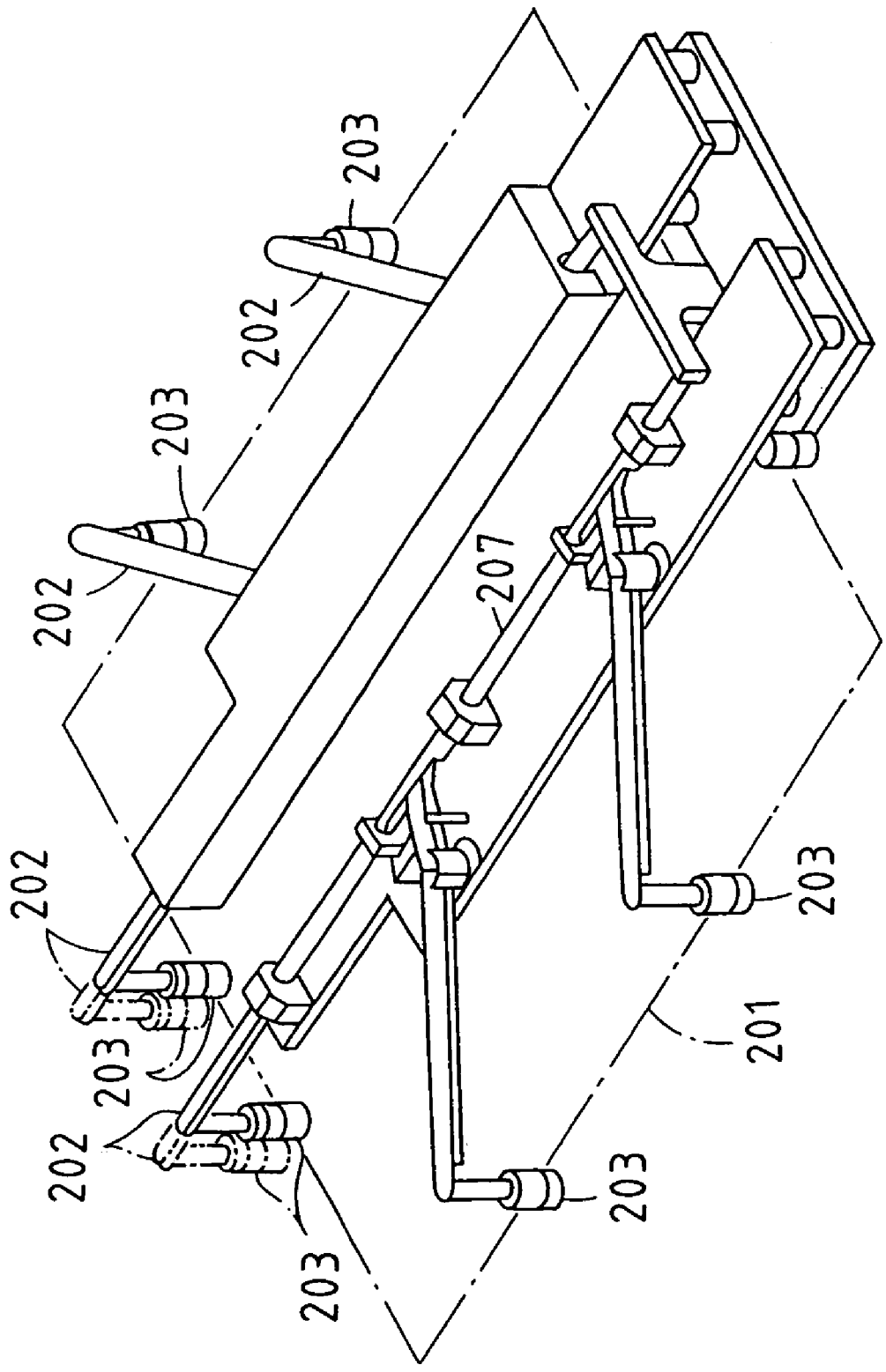
FIG. 21 is an oblique view showing details of mechanical chuck means therein.

Then, as shown in FIG. 19, after raising elevator pin(s) 71 other than elevator pin(s) 71 at location(s) corresponding to the upstream side in the workpiece transport direction of downstream transport stage 65, only elevator pin(s) 71 at location(s) corresponding to the downstream side in the workpiece transport direction of upstream transport stage 55 is/are lowered, forming a transport path between the two transport stages 55, 65, following which workpiece W glides, under the force of its own weight, from the downstream side in the workpiece transport direction of upstream transport stage 55 to a location over downstream transport stage 65 via the upstream side in the workpiece transport direction thereof, workpiece W being transferred to downstream transport stage 65 due to expulsion of gas by way of respective supply passages 65*b* from gas expulsion orifices 65*c* and suction of gas by way of suction passages 65*e* from respective gas suction orifices 65*d* at such downstream transport stage 65.

Thereafter, upstream transport stage 55 of upstream workpiece rotation region 5 is rotated counterclockwise in the plane of the paper at FIG. 18 about pivot shaft 54, and downstream transport stage 65 of downstream workpiece rotation region 6 is rotated clockwise about pivot shaft 64, causing the apparatus to return to the state shown in FIGS. 14 and 16. At such time as well, in the event that there is a possibility that upstream and downstream transport stages 55, 65 could interfere with each other, and/or that either or both could interfere with introduction stage 22 and/or exit stage 32 as upstream transport stage 55 is rotated about pivot shaft 54 and/or downstream transport stage 65 is rotated about pivot shaft 64, extension of extensible shafts 53, 63 and/or sliding in the transport direction over rails 49 by way of sliders 51, 61 makes it possible to easily avoid interference.

Thereafter, all of the respective elevator pins 71 at upstream transport stage 55 and downstream transport stage 65 are lowered, and workpiece W, lifted in floating fashion above downstream transport stage 65, is transported to exit stage 32 of exit region 3, gas expelled from respective gas expulsion orifices at such exit stage 32 being made to strike workpiece W, following which suction by respective gas suction orifices causes workpiece W to be transferred to exit stage 32 such that it is lifted in floating fashion thereabove.

In this way, while periphery or peripheries of workpiece(s) W lifted in floating fashion at upstream transport stage 55 by simultaneous expulsion and suction of gas(es) is/are retained as a result of raising of respective elevator pin(s) 71, upstream transport stage 55 is rotated clockwise in the plane of the paper at FIG. 18 about pivot shaft 54 to a tilt angle from 135° to less than 180° and downstream transport stage 65 is rotated counterclockwise as shown at FIG. 18 about pivot shaft 64 to a tilt angle causing same to face, across the workpiece transport direction, such rotated upstream transport stage 55 (i.e., to a tilt angle causing downstream transport stage 65 to become more or less parallel to upstream transport stage 55), following which elevator pin(s) 71 other than elevator pin(s) 71 at location(s) corresponding to the upstream side in the workpiece transport direction of downstream transport stage 65 are raised, and thereafter only elevator pin(s) 71 at location(s) corresponding to the downstream side in the workpiece transport direction of upstream transport stage 55 is/are lowered, forming a transport path between the two transport stages 55, 65, following which workpiece(s) W glides, under the force of its/their own weight(s), from the downstream side in the workpiece transport direction of upstream transport stage 55 to location(s) over downstream transport stage 65 via the upstream side in the workpiece transport direction thereof, workpiece(s) W being transferred such that workpiece(s) W is/are lifted in floating fashion due to simultaneous expulsion and suction of gas(es) at such downstream transport stage 65. As a result, even where increased size of workpiece(s) W causes occurrence of bowing at workpiece(s) W and/or where workpiece(s) W was/were already bowed at the outset, workpiece(s) W lifted in floating fashion at upstream transport stage 55 by simultaneous expulsion and suction of gas(es) is/are smoothly flipped so as to reverse front and back sides thereof while periphery or peripheries thereof is/are retained as a result of raising of respective elevator pin(s) 71; following which formation of a transport path between the two transport stages 55, 65 is accompanied by transfer of workpiece(s) W from upstream transport stage 55 to downstream transport stage 65 such that workpiece(s) W is/are lifted in floating fashion thereabove, making it possible to definitively prevent occurrence of workpiece W droppage, breakage, cracking, chipping and/or the like during transport and/or flipping to reverse front and back sides thereof.

Furthermore, chucking of workpiece(s) W being carried out by merely causing simple elevator-type action(s) implemented by respective elevator pin(s) 71, generation of particles from surrounding regions can be held to a minimum. And not only can the number of mechanical parts be reduced, failure be made unlikely to occur, and less labor be expended during servicing thereof, but the apparatus can also be made extremely compact in size.

In addition, workpiece(s) W and/or process(es) are not adversely affected by static electricity such as would be the case where a vacuum chuck or electrostatic chuck is employed, and it is possible to definitively prevent workpiece(s) W and/or process(es) from being adversely affected by static electricity.

Other Embodiments

The present invention encompassing a wide variety of variations in addition thereto, the present invention is not to be limited by the respective foregoing embodiments. For example, whereas transport at workpiece introduction region 2 as workpiece W is introduced to workpiece rotation region 1 and/or upstream workpiece rotation region 5, and/or transport at workpiece exit region 3 as workpiece W exits from workpiece rotation region 1 and/or downstream workpiece rotation region 6 was in the foregoing respective embodiments carried out such that workpiece W is lifted in floating fashion as a result of expulsion of gas(es) and/or simultaneous expulsion and suction of gas(es), the manner(s) in which workpiece(s) is/are introduced and/or discharged is/are not limited thereto; it being possible to carry out transport by means of roller(s) and/or to carry out transport at stage(s) where workpiece(s) is/are not lifted in floating fashion.

Furthermore, whereas workpiece W was in the foregoing respective embodiments lifted in floating fashion as a result of expulsion of gas(es) and/or simultaneous expulsion and suction of gas(es), workpiece W may be lifted in floating fashion as a result of expulsion of liquid(s) and/or simultaneous expulsion and suction of liquid(s), in which case this would be limited to liquid(s) not adversely affecting workpiece(s) and/or process(es).

Moreover, whereas the foregoing respective embodiments were described in terms of examples in which more or less rectangular workpiece(s) W is/are transported, the present invention may of course be applied to circular workpiece(s), in which case it would be sufficient that elevator pin arrangement be modified so as to conform to circular workpiece(s).

Also, whereas in the foregoing first embodiment a plurality of elevator pins 16 were provided at first transport stage 14, such plurality of elevator pins may be provided at only the second transport stage or same may be provided at both transport stages. Furthermore, whereas periphery or peripheries of workpiece(s) W was or were retained by plurality of elevator pins 16, 17, periphery or peripheries of workpiece(s) W may be retained by guide frame(s) of the type which can be opened and closed, or the like.

The present invention may be embodied in a wide variety of forms other than those presented herein without departing from the spirit or essential characteristics thereof. The foregoing embodiments and working examples, therefore, are in all respects merely illustrative and are not to be construed in limiting fashion. The scope of the present invention being as indicated by the claims, it is not to be constrained in any way whatsoever by the body of the specification. All modifications and changes within the range of equivalents of the claims are moreover within the scope of the present invention.

What is claimed is:

1. A workpiece transport apparatus comprising:
   at least one pair of transport stages, each transport stage of each said pair of transport stages being disposed in a horizontally opposing manner to the other transport stage of said pair of transport stages and including fluidic expulsion means or simultaneously operable fluidic expulsion means and fluidic suction means for lifting and transporting one or more workpieces in a floating fashion therebetween;
   at least one plurality of elevator pins capable of being raised and lowered disposed on at least one transport stage of each of the at least one pair of transport stages such that when raised, said elevator pins are adapted to surround a periphery of at least one workpiece, and to retain the at least one workpiece in a floating fashion between said pair of opposing transport stages by a tip portion of each of said raised elevator pins contacting with or mating with the transport stage opposite to the transport stage from which said at least one plurality of elevator pins are raised; and
   at least one rotating mechanism for rotating the transport stages of each of said at least one pair of transport stages so as to cause the individual transport stages of each of said pairs of transport stages to be inverted relative to one another;
   whereby each of said at least one pair of transport stages may transfer at least one workpiece peripherally retained by at least one plurality of said elevator pins raised from a lower one of said pair of transport stages facing an upper one of said pair of transport stages onto the upper one of said pair of transport stages facing said lower transport stage by using the rotating mechanism associated with said pair of transport stages to invert said pair of transport stages in accompaniment with lowering the elevator pins retaining said at least one workpiece following said inversion of said pair of transport stages.

2. A workpiece transport apparatus according to claim 1 wherein:
   at least a portion of each respective elevator pin of each plurality of elevator pins is at least partially coated with a material having vibration-damping and/or cushioning properties, each said material having rubber, resin, and/or gel-like silicone as a primary component.

3. A workpiece transport apparatus according to claim 1 wherein:
   at least a portion of each of the at least one pair of transport stages is supported so as to permit horizontal or vertical movement.

* * * * *